(12) United States Patent
Hollars et al.

(10) Patent No.: US 6,231,732 B1
(45) Date of Patent: *May 15, 2001

(54) CYLINDRICAL CARRIAGE SPUTTERING SYSTEM

(75) Inventors: Dennis R. Hollars, San Jose; Robert B. Zubeck, Los Altos, both of CA (US)

(73) Assignee: SciVac, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/284,210
(22) PCT Filed: Aug. 26, 1997
(86) PCT No.: PCT/US97/15062
 § 371 Date: Sep. 2, 1999
 § 102(e) Date: Sep. 2, 1999
(87) PCT Pub. No.: WO98/08997
 PCT Pub. Date: Mar. 5, 1998
(51) Int. Cl.$^7$ ..................................... C23L 14/34
(52) U.S. Cl. ................ 204/298.26; 204/298.09; 204/298.15; 204/298.23; 204/298.25; 204/298.28; 118/58; 118/69; 118/503; 118/719
(58) Field of Search .......... 204/298.09, 298.15, 204/298.23, 298.25, 298.26, 298.28; 118/719, 503, 58, 69

(56) References Cited

U.S. PATENT DOCUMENTS

| | | | |
|---|---|---|---|
| 4,051,010 | * | 9/1977 | Roth et al. ........................... 204/298 |
| 4,126,530 | * | 11/1978 | Thornton ........................ 204/192 EC |
| 4,591,418 | * | 5/1986 | Snyder .............................. 204/192 P |
| 4,798,663 | * | 1/1989 | Herklotz et al. ...................... 204/298 |
| 4,851,095 | * | 7/1989 | Scobey et al. .................. 204/192.12 |
| 5,753,092 | * | 5/1998 | Hollars et al. .................. 204/298.26 |

* cited by examiner

Primary Examiner—Nam Nguyen
Assistant Examiner—Steven H. Ver Steeg
(74) Attorney, Agent, or Firm—Oppenheimer, Wolff & Donnelly, LLP; Claude A. S. Hamrick

(57) ABSTRACT

A cylindrical carriage sputtering system for disk, wafer, and flat panel substrates (20) comprising a cylindrical shaped vacuum sealed passageway formed by two concentric inner (11) and outer hollow cylinders (12), along with a top and a bottom sealing flange (13, 14). A central hollow cylinder (15), disposed between the inner (11) and outer cylinder (12), includes substrate-carrying openings and serves as a cylindrical carriage which substantially fills the sealed passageway and is rotatable in predetermined steps. Novel substrate processing devices (16) for deposition, heating, and cooling are attached around the circumference of the inner and outer cylindrical walls. Vacuum pumps are located between substrate processing devices (16). The openings in the cylindrical carriage are each fitted with thermally isolated substrate holders (19) for supporting a multiplicity of substrates (20). Unique entrance and exit vacuum load-locks with integrated robotic means are provided for transferring disk substrates (20) into and out of the system. The sputtering system is designed to allow the processing of substrates (20) at temperatures of up to about 1000° C. on either stationary or pass-through sputtering modes.

42 Claims, 13 Drawing Sheets

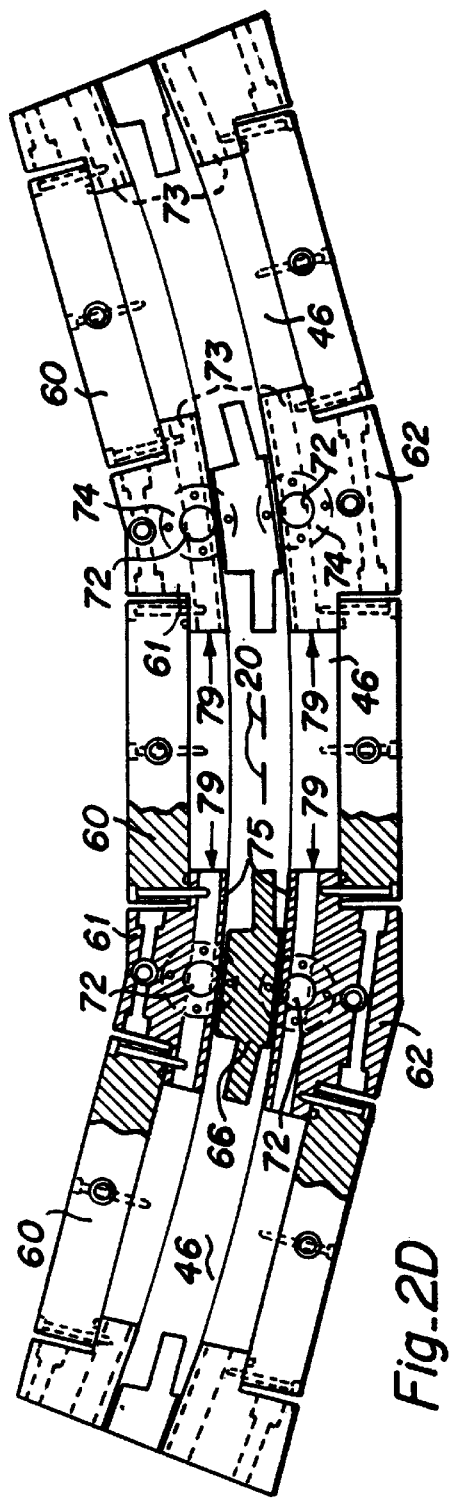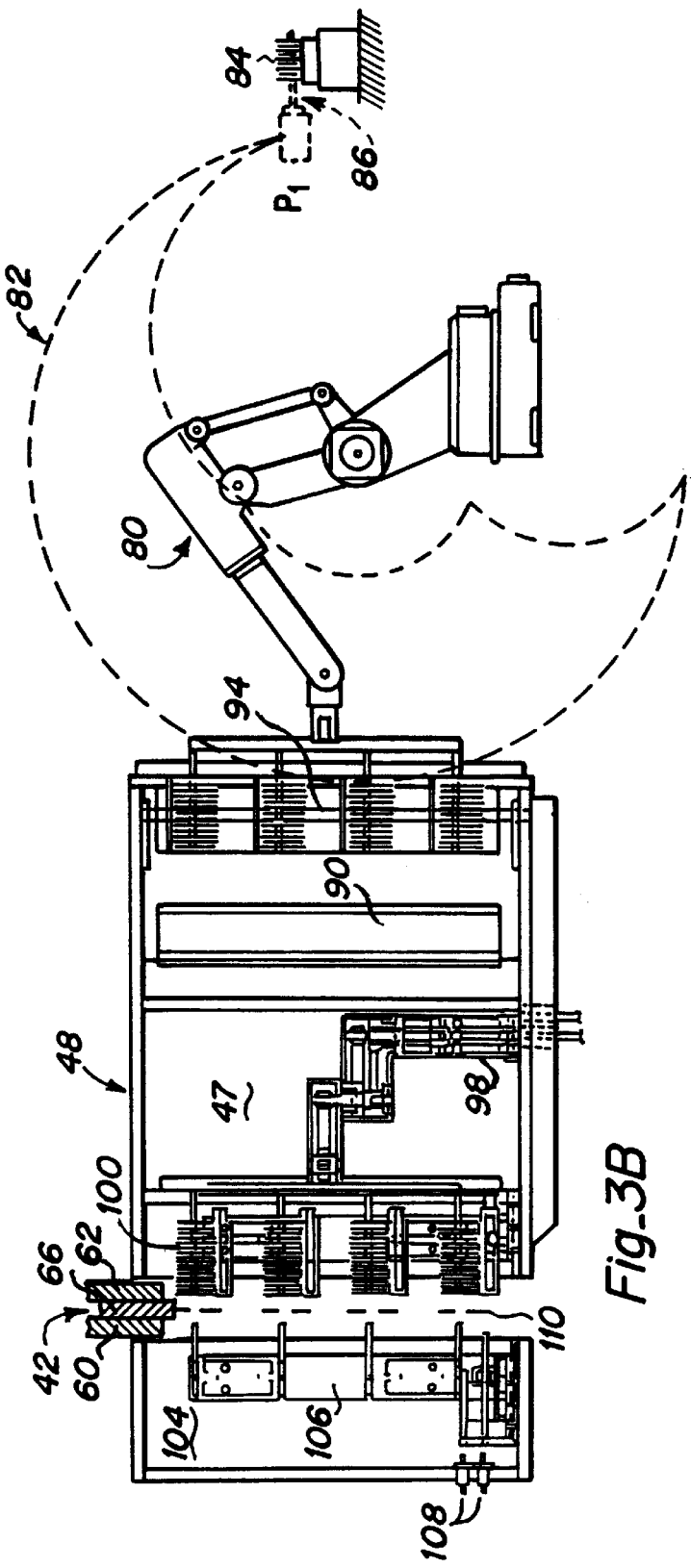
Fig. 2D
Fig. 3B

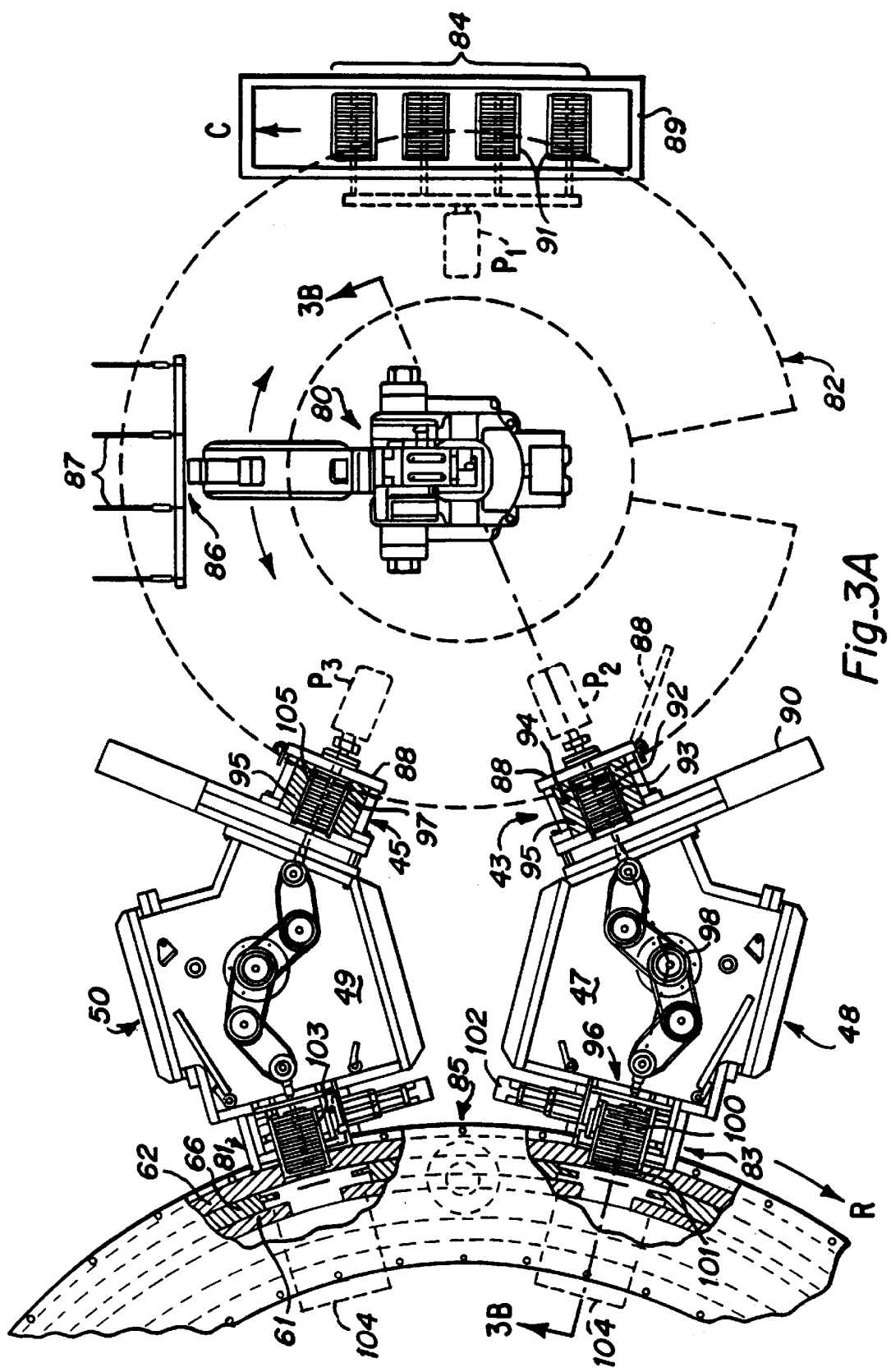

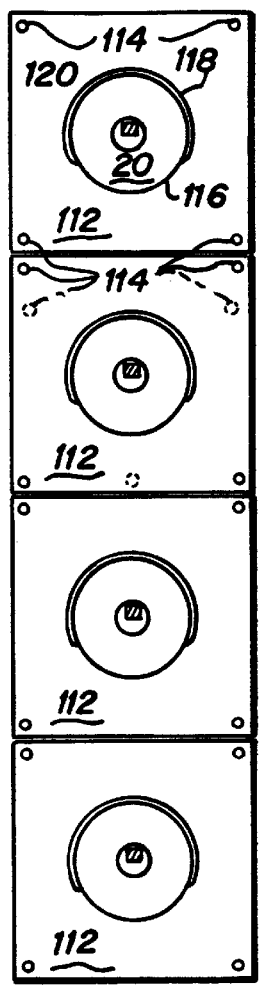
Fig._4A
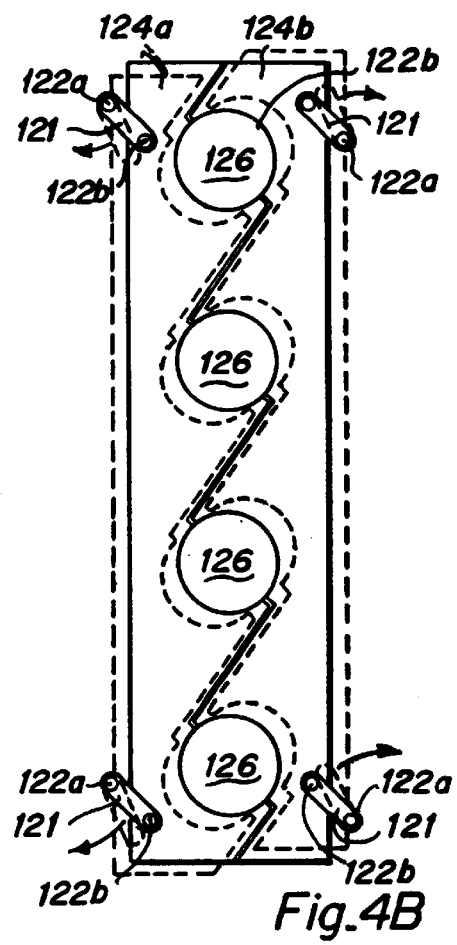
Fig._4B
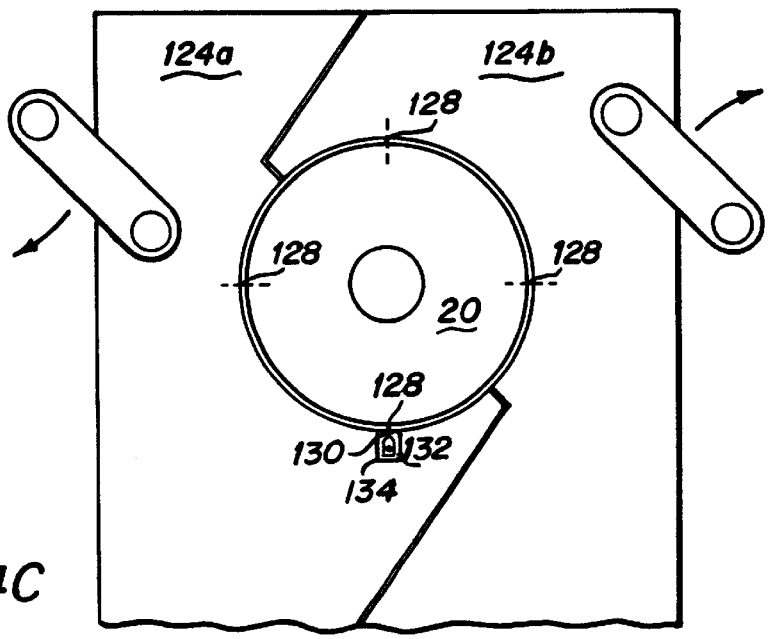
Fig._4C

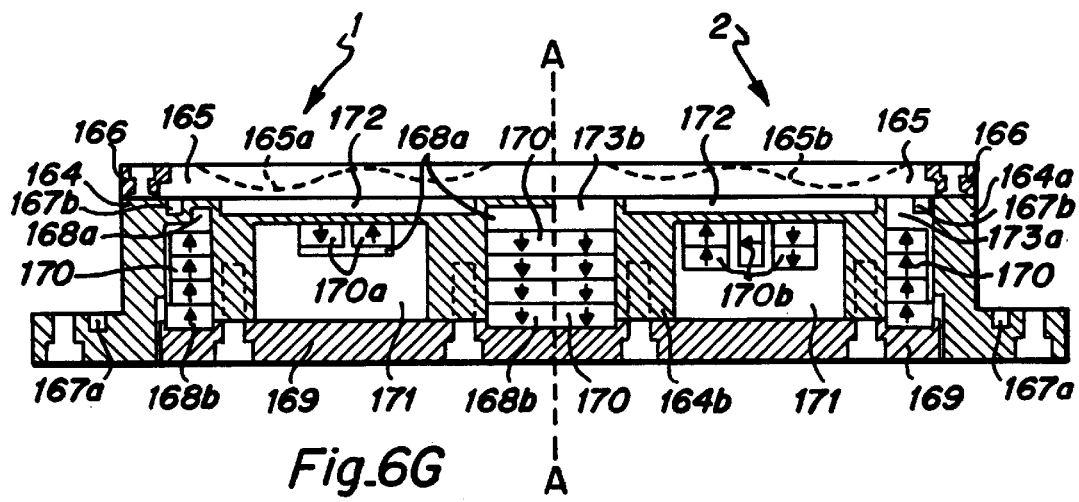
Fig.6G
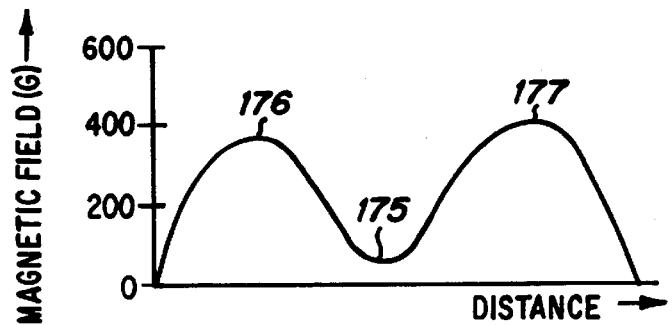
Fig.6H
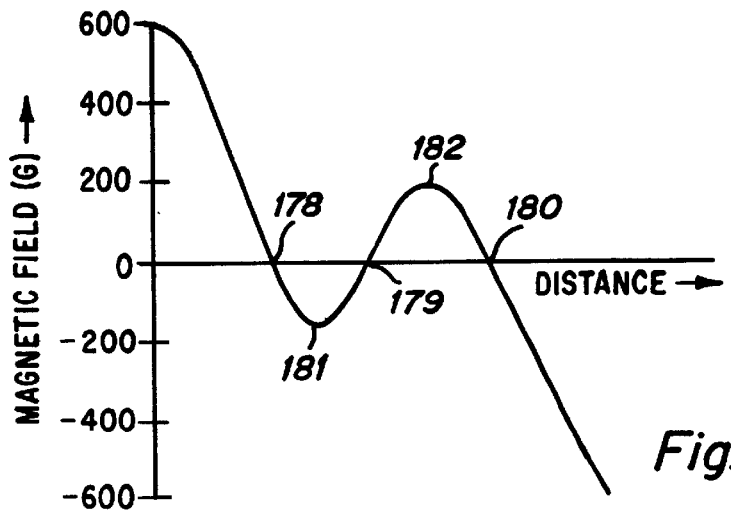
Fig.I

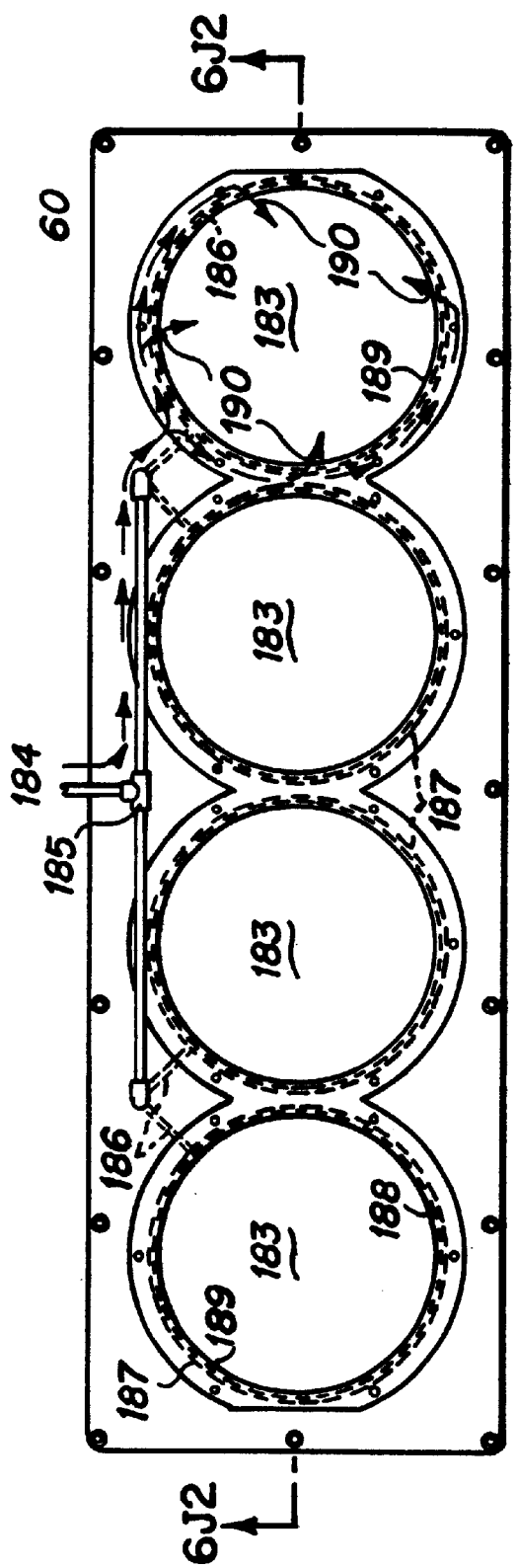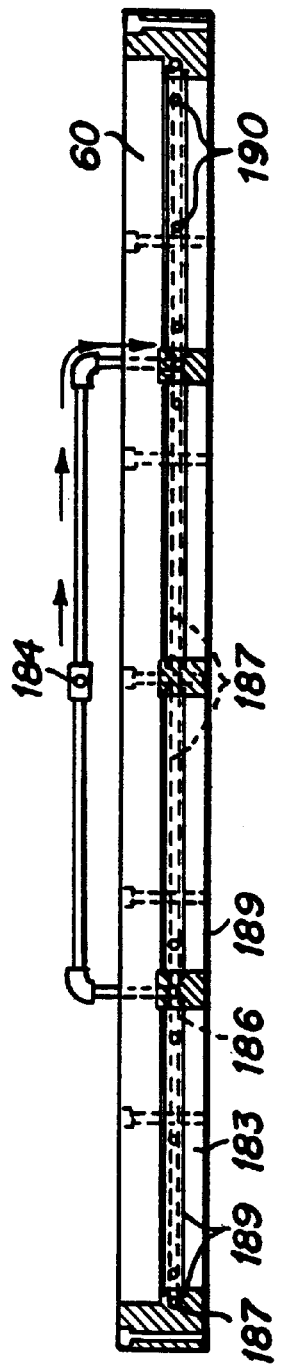
Fig. 6J1
Fig. 6J2

CYLINDRICAL CARRIAGE SPUTTERING SYSTEM

BACKGROUND OF THE INVENTION

1. Field of the Invention

This invention relates generally to substrate handling and coating systems, and more particularly to a novel dual mode step and dwell or pass-through design for the construction of a sputtering machine apparatus for coating computer memory media, and including a cylindrical shaped vacuum chamber and apparatus for the holding, transporting, heating, cooling, and coating of a multiplicity of disk substrates.

2. Brief Description of the Prior Art

Hard disk drives provide fast, non-volatile, rewritable and economical computer memory. Virtually all disk media, such as magnetic hard disks, magneto-optical disks and phase-change optical disks, involve coatings by various physical deposition techniques such as sputtering or chemical deposition. Currently, the computer memory disk media industry utilizes two general types of sputtering machines for the sputter-deposition of a succession of various layers onto the disk surfaces to produce the memory media.

The first type of sputtering machine is an in-line or "pass-through" machine. It consists of either a linear arrangement of relatively small individual but connected chambers, or one or two long chambers with vacuum transition locks at each end of the line. Processing stations are located either along the long chambers or at each individual chamber. During deposition, a multiple-disk substrate carrier, called a pallet, continuously passes in front of the sputtering targets or sources. U.S. Pat. No. 4,894,133, issued to Hedgcoth and entitled "Method and Apparatus for Making Magnetic Recording Disk." describes such an in-line machine. Another example is taught by U.S. Pat. No. 4,749,465, issued to Flint et al. and entitled "In-Line Disk Sputtering System." This machine uses a massive block with a semi-circular groove rather than the conventional pallet to hold the disks. Still another example of this type of machine is taught by U.S. Pat. No. 3,290,670, issued to Charschan et al. and entitled "Apparatus for Processing Materials in a Controlled Atmosphere." Vendors of large machines of this type include Ulvac of Japan, Leybold of Germany, and Wilder Associates (formally Circuit Processing Apparatus) of the USA. In addition, some companies custom build their own large in-line machines for in-house use.

A second type of sputtering machine is a stationary or "static deposition" machine. In these machines, a single disk substrate moves in succession from one processing station to the next, where various processing steps, such as heating, sputtering and cooling, take place while the substrate remains fixed with respect to the processing source (hence the terminology "static machine"). Typically, the processing stations in static systems are arranged along a circular path so that the disk input (loading) and output (unloading) stations are adjacent to each other. Such is the layout of the machine taught in U.S. Pat. No. 5,425,611, issued to Hughes et al. and entitled "Substrate Handling and Processing System." The Intevac MDP-250 memory disk sputtering system made by Intevac is another example of a static system. Of similar layout is another commercial machine, the Circulus 12 built by Balzers/Leybold. Yet another example of a static machine adopting a folded linear design is described in U.S. Pat. No. 4,500,407, issued to Boys and entitled "Disk or Wafer Handling and Coating System." This machine also has the input and output stations adjacent to each other. An exception is the in-line static machine offered by Ulvac, where a pallet carrying several disks stops in front of a group of individual sputtering targets (or sources) each facing a disk in the pallet.

None of the above-described sputtering machines fully satisfies the requirements for the mass production of high-quality hard disks or wafers. The first-mentioned type of machines have relatively high throughput but usually produce excessive debris and defects in the coated disks. Such contamination debris arise from several sources. One source is attributable to the entrance vacuum lock, where rapid pumping of the load-lock stirs the air violently, causing transfer of small particles of debris from the pallet and the chamber interior to the surface of the disks. The debris particles are generally knocked off the disks by after-coating buffing and/or burnishing, leaving defects in the magnetic memory layer and other layers.

A second source of particulate debris in pass-through machines is the vibrational motion of the disks in the pallet as the pallet moves through the machine. Since the pallet makes many passes through the machine before cleaning, a relatively thick layer of coating gradually builds up on the pallet. The stress in the films builds up with thickness. The combined film stress, thermal cycling and abrasive action between the disk edge and the pallet holder lead to shedding of particulate debris. Some shedding of debris at the disk holder may also occur upon loading the disk onto the pallet; such shedding may occur even if sophisticated robots are used. The pallet-related debris also lead to defects in the layers including the magnetic memory layer.

Arcing or spitting in the carbon overcoat deposition station presents another source of magnetic defects. Most of today's hard disks use hydrogenated carbon (also called diamond-like carbon or DLC) as the overcoat or protective layer. Unlike electrically conductive graphite, hydrogenated carbon is a dielectric. It builds up an insulating layer on various areas of the sputtering target, causing sporadic arcing. The arc-accelerated particles can penetrate the magnetic memory layer and produce memory defects. Although this problem may be minimized by reducing the power supplied to the sputtering target, this also decreases the carbon sputtering rate and accordingly reduces the machine throughput. A better solution to the arcing problem involves the use of a high temperature substrate and a different, e.g., silicon carbide (SiC), overcoat in lieu of the conventional hydrogenated carbon overcoat. However, the SiC sputter-deposition is normally conducted at an elevated temperature, i.e., 700° C. or above to obtain the necessary crystalline structure. Most of the current machines of the first-mentioned type use aluminum pallets that tend to warp, soften or even melt at elevated temperatures. Other pallet materials with higher melting points could be used, but the cost would be prohibitively high.

A static machine carries a single disk at a time sequentially from one processing station to the next. Because no pallet is used, the shedding of debris is greatly reduced, and the process temperature may be higher than that in a typical pass-through machine. As a result, such machines generally produce disks with fewer magnetic defects and debris contamination compared with a pass-through machine. However, these machines have their own drawbacks. First, the one-disk-at-a-time processing in a typical static machine causes its throughput to be two to four times lower than that of a typical pass-through machine. In addition, unless a pass-through machine can be made totally compatible with high-temperature processing, as described in detail below, the problem of arcing during carbon deposition will persist, making it practically impossible to raise the throughput of the machine by simply raising the power to the sputtering target. Finally, because the equipment costs of the two types of machines are similar, the per-disk manufacturing cost for a static machine is generally noticeably higher than that for a pass-through machine. In short, because future magnetic hard disk drives, with higher packing densities, will command low-cost disks with extremely low defects, there is an urgent need to raise the throughput of a static machine to the level of a pass-through machine without sacrificing quality or cost.

Current magnetic disk sputtering machines have several additional limitations. One of the most severe limitations is that they generally are not compatible with high-temperature processing dictated by newly developed, advanced substrate and coating materials. Currently, most magnetic hard disk substrates comprise non-magnetic nickel phosphorus plated aluminum (NiP/Al). This substrate cannot be heated above approximately 300° C. due to phase segregation in the NiP, which renders it magnetic and, therefore, useless. Also, the NiP/Al substrates begin to warp and deform long before the aluminum melting point of 660° C. is reached. Development work has been done on alternative substrate materials, e.g., silicon carbide, glass and ceramics, and on alternative overcoat materials, e.g., silicon carbide. Future disk coating machines must be compatible with these new materials.

A first issue in connection with this high-temperature compatibility problem is that heating devices in current magnetic disk sputtering machines are often not designed for rapid high-temperature processing. To maintain the throughput of the machine, it is desirable to have new heating devices that will rapidly heat up disks to the processing temperatures and, in particular, to the high processing temperatures (e.g., 1000° C.) dictated by the aforesaid advanced substrate and coating materials in approximately the same length of time as for heating NiP/Al substrates in current machines. Additionally, it is desirable that the new heating device has improved substrate thermal isolation so that most of the thermal energy will go to the substrate but not its surroundings.

A second issue in connection with the aforementioned compatibility problem is that cooling methods and devices in current magnetic disk sputtering machines are often not designed for rapid cooling, either. The hydrogen content in the hydrogenated carbon film decreases as the substrate temperature increases. To possess certain desirable tribological properties, the hydrogenated carbon film preferably contains a certain amount of hydrogen. Hence, to ensure proper hydrogen content in the sputtered carbon film, substrates must be cooled in special cooling stations prior to the carbon deposition. This additional step will slow down the process unless it is efficient. Various prior art methods have been used for cooling substrates in evacuated chambers. One example is U.S. Pat. No. 4,909,314, issued to Lamont, Jr. and entitled "Apparatus for Thermal Treatment of a Wafer in an Evacuated Environment," which teaches a near-contact heat exchanging body configured in the shape of the article to be cooled. The surface of the article and the heat exchanging surface are not in intimate thermal contact. Rather, a conductive gas at a pressure significantly higher than that in the vacuum chamber but significantly lower than the atmospheric pressure is introduced between the two surfaces to fill the voids and improve the heat exchange between them. Another example is U.S. Pat. No. 5,287,914, issued to Hughes and entitled "System for Substrate Cooling in an Evacuated Environment," which teaches a stationary cooling system for thin substrates. This system employs a space or gap between the heat exchanger and the substrate. A highly conductive gas (e.g., helium) at a pressure of a few torr is introduced into the space to cool the substrate surface through both conduction and convection. However, even a highly heat-conductive gas is not a good heat conductor in comparison to most solids. Convective gaseous heat transport at such relative low pressures is not very effective, either. As a result, neither of these devices provides sufficient cooling for substrates. As a specific example, in the Hughes method above, the cooling rates across the 0.05 to 0.25 inch gap are only about 150° C. per minute under ideal conditions. In a high-throughput disk coating machine, substrates are typically transported to the next processing station every 10 seconds or less. This means that substrates can only be cooled by about 25° C. at a single cooling station. Furthermore, many new substrates, e.g., silicon carbide, are processed at temperatures above 700° C. Therefore, to maintain the throughput of the machine, it is desirable to have new cooling devices that will cool down the disks more rapidly, particularly if high-temperature processing is involved.

Another limitation of typical current magnetic disk sputtering machines is that their process monitoring and control methods and setups are often either ineffective or overly complicated. To allow rapid detection and correction of problems associated with each of the processes, so that the overall product yield can be improved, there is a need for a simple yet effective process monitoring and control system that can be built into essentially all of the processing stations of a coating machine.

Yet another limitation of typical current magnetic disk sputtering machines is that their substrate holders do not meet the requirements of a high-quality, high-throughput coating machine. Typically, a disk in a static machine seats in the holder by gravity. To allow for rapid acceleration and deceleration associated with faster disk transport from one processing station to the next, disks need to be supported more solidly in the machine without merely relying upon gravity to seat them into the holders. In addition, the holder and shields must work together to confine the coating flux to the substrate and minimize coating of the holder, so that flaking of particulate debris from the holder can be reduced. An improved substrate holder should also be operable at elevated temperatures, e.g., 1000° C., to permit processing of advanced substrate and coating materials described above.

In addition to the problem of holding and heating the substrate, there is an increasing demand within the disk drive industry to coat the disk uniformly to its extreme outer edge. The current art in disk substrate manufacturing and coating does not permit a totally acceptable solution to the problem. An improved substrate holder and coating system should also provide a unique and easily implemented solution to the problem of coating the disk substrate uniformly to its extreme outer edge.

A further limitation of typical current magnetic disk sputtering machines is that their sputtering magnetrons are not optimally designed for coating either single or multiple substrates. Planar sputtering magnetrons using permanent magnets have been used in the prior art, mostly for coating from a variety of electrically conductive targets. For example, U.S. Pat. No. 5,262,028, issued to Manley and entitled "Planar Magnetron Sputtering Magnet Assembly," teaches both circular and rectangular planar magnetron designs, whose improved magnetic pole-piece structures and magnet placement allow much better utilization of the target material. Another example is U.S. Pat. No. 4,818,358, issued to Hubert et al. and entitled "Magnetron Cathode Sputter Coating Apparatus," teaches the use of an arrangement of oriented magnets to form two curved racetracks on a rectangular planar magnetron. Other prior art shown in U.S. Pat. No. 4,865,708 to Welty, U.S. Pat. No. 4,964,968 to Arita, and U.S. Pat. No. 5,415,754 to Manley as well as application PCT/US92/00722 to Hollars et al also concentrate on designs for improved utilization of target material. For the circular planar magnetrons used to coat a single disk substrate in static mode, this improvement in target utilization actually causes non-uniform coating thickness and non-uniform coating properties on the disk. It is, therefore, desirable to have an improved circular planar magnetron which provides uniform coatings and coating properties, and an improved rectangular type magnetron for coating in the passthrough mode which is powered by a single power supply, and allows the simultaneous processing of a multiplicity of disk or wafer substrates at a given processing station.

All of the patents mentioned above are hereby incorporated by reference for purposes of additional disclosure.

SUMMARY OF THE INVENTION

Accordingly, it is an object of the present invention to provide a high-throughput substrate coating machine without sacrificing quality and cost achievable with the prior-art coating machines. The coating machine will have the capability of being operated in either the static or the passthrough mode, offering potential users a choice of process configuration, or the ability to change the configuration.

A second object of the present invention is to provide an extremely clean robotics load/unload and pumping/venting system.

Another object of the present invention is to provide a memory disk substrate sputtering machine compatible with processing at elevated temperatures (e.g., 1000° C. and above) dictated by advanced substrate and coating materials.

Yet another object of the present invention is to provide a process monitoring and control system that can be used for effective and reliable process monitoring and control purposes.

Still another object of the present invention is to provide an improved substrate holder suitable for a high-throughput, high-disk or wafer quality coating machine, particularly when elevated processing temperatures are involved.

Yet another object of the present invention is to provide a heating device that has improved substrate thermal isolation and can rapidly heat substrates to the desired processing temperatures.

Another object of the present invention is to provide a cooling device that can cool down substrates rapidly from the processing temperatures, particularly when elevated processing temperatures are involved.

A further object of the present invention is to provide a magnetron design suitable for coating machines, particularly if sputter-deposition of multiple disks or wafers is involved.

According to one aspect of the present invention, the coating machine comprises essentially three concentric hollow cylinders. The inner and the outer hollow cylinders have a plurality of cutouts to accommodate a plurality of stations including an input station, an output station, a plurality of processing stations, and a plurality of pumping stations. The central hollow cylinder, i.e., the cylindrical carriage, has cutouts, each of which is adapted to carry one or more substrates. The central hollow cylinder rotates, in incremental steps, relative to the two outer cylinders, causing the substrates to be transported and processed from one station to the next without the use of pallets. The cylindrical carriage substantially fills the volume between the inner and outer hollow cylinders. Tight tolerance clearances between the outer cylinder walls and the central cylinder (cylindrical carriage) ensures process gas isolation between the stations without the need for internal doors, conventional vacuum seals or valves separating chambers. The machine design and choice of materials used in its construction permit the processing of substrates at elevated temperatures (e.g., above 1000° C.). In one particular embodiment of the invention, the input and output stations are adjacent, mirror images of each other. In an alternate embodiment they can be combined into a single vacuum chamber for both loading and unloading of substrates.

According to another aspect of the present invention, a new simple and reliable process monitoring and control system can be used with the coating machine. Essentially, passageways are formed within either or both of the inner and the outer cylinders near any of the processing stations. Such a passageway houses optical means for guiding light from the interior of the station to a set of appropriately chosen optical filters. Light signals passing through these filters are then processed and their intensity ratios or "color differences" are used for the purposes of monitoring and control of the process.

In accordance with yet another aspect of the present invention, new substrate holding devices each accommodating one or more substrates can be used with the above coating machine. Essentially, each new holding device comprises a plurality of panels mounted on the substrate-carrying part of the machine, e.g., the cylindrical carriage described above. The panels are held together by, e.g., springs and/or pivoting arms, so that they can be mechanically spread apart for the loading and unloading of the substrates. Each substrate is held in place in a specially designed shallow groove called a "coinslot", or by "fingers" each with a notched or forked end that holds the edge of the substrate. In a preferred embodiment, the fingers are electrically conducting whereas the panels are electrically insulated from the machine, so that a substrate bias voltage can be applied during sputtering.

A further improvement to the substrate holding device utilizes a set of knife-edge shaped "fingers" instead of the more conventional notched or forked "fingers" that are positioned in a circumferentially cut "V" groove around the outer edge of the substrate. This method of holding the substrates does not shadow any part of the edge of the substrate, thus allowing uniform coating to the extreme edge. In addition, the knife-edge tip of the "fingers" are not coated at the point of contact to the substrate because they are shadowed by the "V" groove in the edge. This allows longer coating runs with good substrate registration before a change of the "fingers" is required.

According to still another aspect of the present invention, new heating devices can be used at processing stations of the coating machine. Essentially, each heating device comprises a heating means for providing thermal energy, shielding means for directing thermal energy toward the substrates, and a means for retracting the heating device from or moving it into its operating position. In a preferred embodiment, the shielding means are separately cooled to remove thermal energy transferred thereto.

Yet another aspect of the present invention provides new cooling devices that are used at processing stations of the coating machine. Essentially, each cooling device comprises one or more pairs of platens that can be moved to close proximity with one or more substrates, heat-absorbing, separately cooled shielding means for removing radiant heat from substrates, a gas source for providing a conductive gas to the surfaces of the substrates, passageways for removing such gas from the processing station, and a means for retracting the cooling device from or moving it into its operating position. The interior of the cooling device is so designed that, when the device is at its operating position, local pressure of the conductive gas around the substrate is significantly higher than what can be achieved in the prior art, thus greatly enhancing conductive and convective heat transfer from the substrate. In a preferred embodiment, the platens are coated with heat-absorbing layers and are separately cooled to enhance heat transfer. In an embodiment particularly suitable for high-temperature processing, the platens are coated with compliant layers and brought into intimate thermal contact with the substrates to further enhance heat transfer. According to still another aspect of the present invention, magnetrons of new design are utilized for the two modes of operation of the coating machine. For static mode deposition the circular planar magnetron features the use of permanent high energy density magnets exclusively with unique magnetic field shaping designs. For the pass-through mode a new cylindrical rotary magnetron design has a narrow sputtering groove and high utilization of target material. To date cylindrical rotary magnetrons have not been designed and built for use in the disk or wafer coating industry.

An advantage of the present invention is that the new coating machine can produce memory disks and semiconductor wafers having a high degree of cleanliness without sacrificing the machine throughput.

Another advantage of the present invention is that the manufacturing cost per substrate is significantly reduced compared to prior-art static or pass-through coating machines.

Yet another advantage of the present invention is that it is compatible with high-temperature substrate and coating materials that are becoming industrial standard materials for advanced memory disks.

Still another advantage of the present invention is that it can process multiple memory disks or wafer substrates simultaneously without demanding a large floor-space footprint.

Yet another advantage of the present invention is that its simple yet effective process monitoring and control system provides a reliable and cost-effective means for manufacturing quality control.

Still another advantage of the present invention is that it has improved magnetron sputtering devices that allow more effective and economical use of the target materials.

These and other objects, features and advantages of the present invention will no doubt become apparent to those skilled in the art after having read the following detailed description of the preferred embodiments which are illustrated in the several figures of the drawings.

IN THE DRAWINGS

FIG. 2d is a planar cross-sectional view taken through three stations of the cylindrical carriage sputtering system with blank-off plates covering the openings to reduce the level of complexity of the drawing, it being understood that process equipment and vacuum pumps would, in practice, normally be mounted on the plates.

FIG. 3a is a plan view of the disk load and unload equipment including the external robot, load and unload locks, disk transfer chambers, internal transfer robots, and disk walking or indexing holders.

FIG. 3b is a vertical cross-sectional view of the disk load and unload equipment taken generally along the line 3b—3b of FIG. 3a and showing in addition the four mandrel robot mounted opposite the walking disk holders.

FIG. 4c further illustrates the disk mounting details of the disk holder described in FIG. 4b.

Figure 4D:
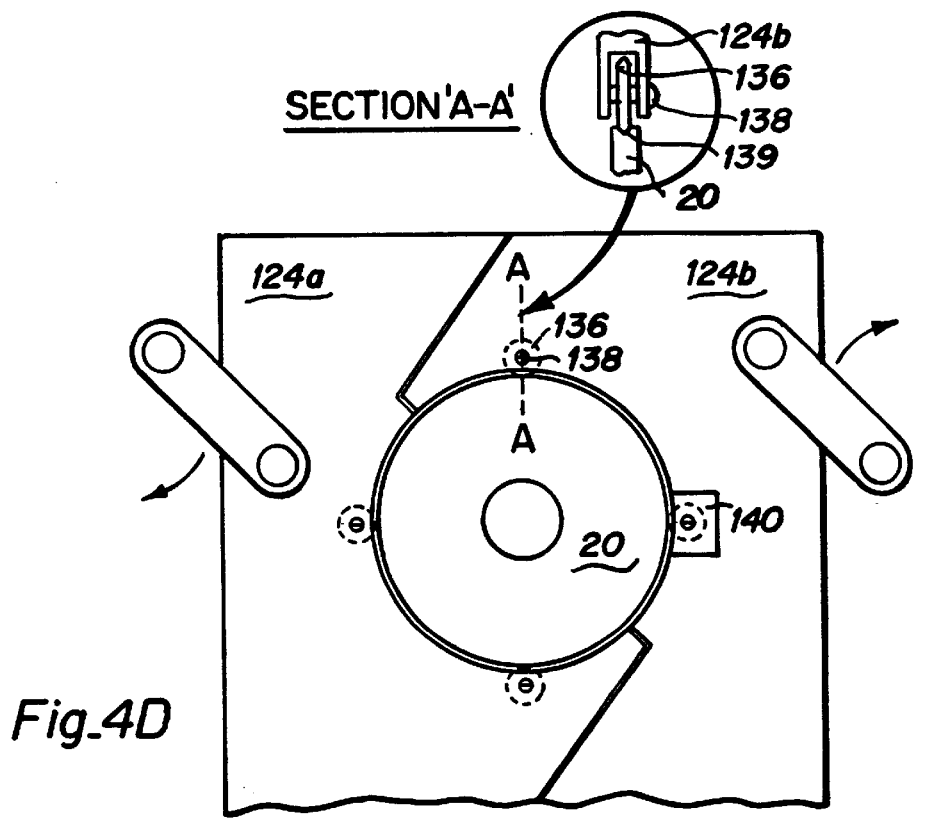
FIG. 4a illustrates a disk substrate holder consisting of four independent holders each with a slot to hold the disk and each being individually adjustable.
FIG. 4b illustrates an alternative disk substrate holder consisting of a bi-sectional plate with pivots for separating the plates to facilitate the loading and unloading of substrates.

FIG. 4d illustrates an alternative disk holder using a rotary knife edge support which allows the disk substrate to be coated to its extreme edge.

Figure 5A:
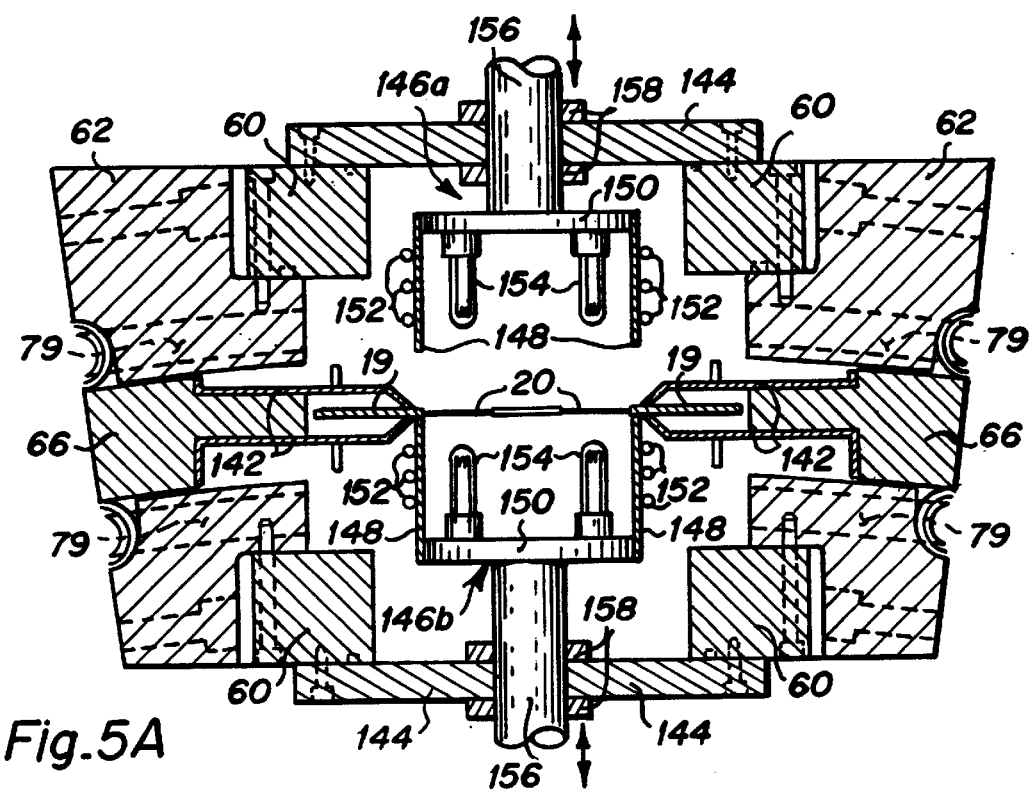

FIG. 5a is a schematic cross-sectional plan view taken through a single station and illustrating a highly thermally isolated heating device for disk substrates.

Figure 5B:
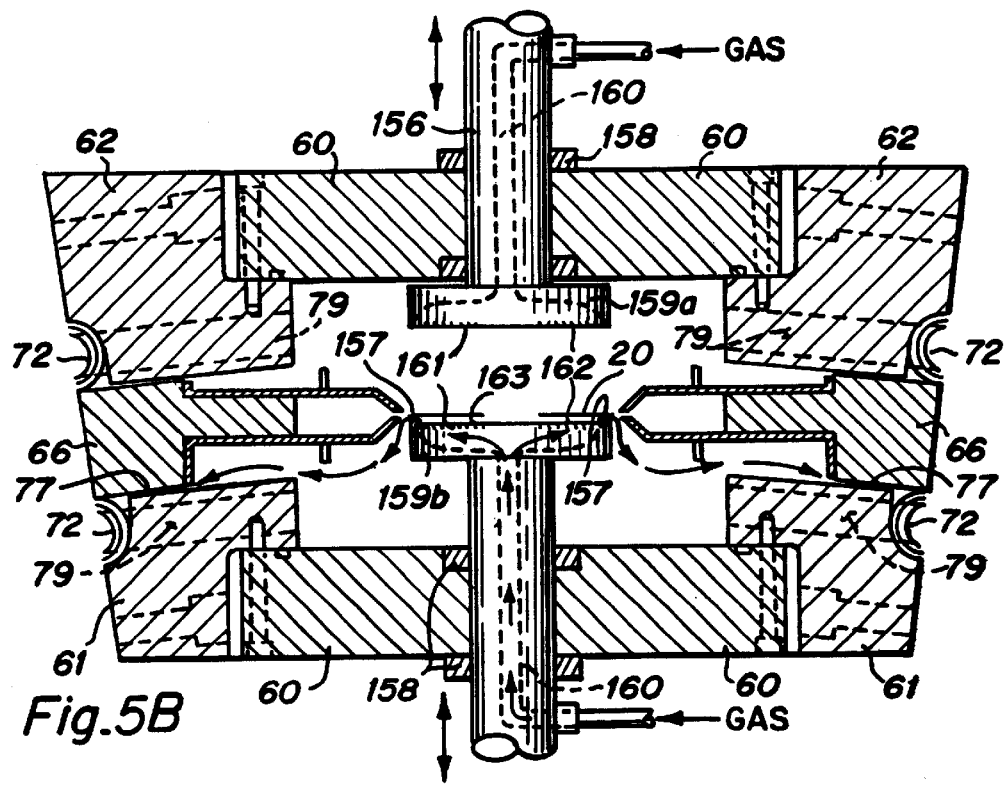

FIG. 5b is a schematic cross-sectional plan view taken through a single station and illustrating a high gas pressure cooling device for disk substrates.

Figure 6A:
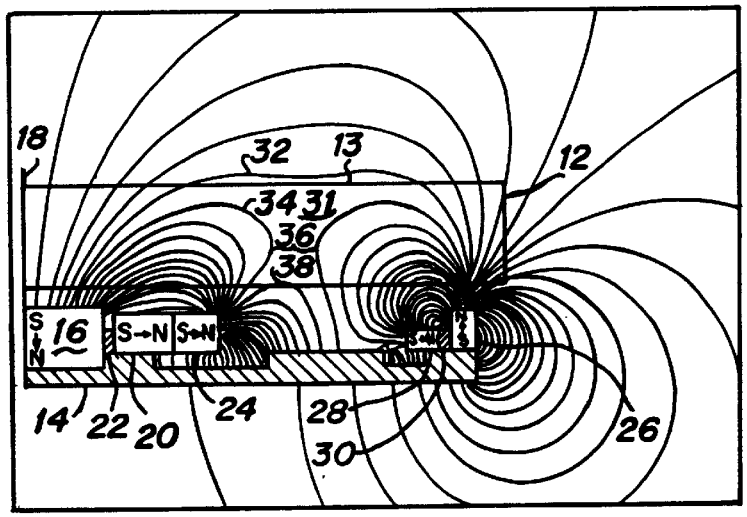

FIG. 6a is a cross-sectional view showing the arrangement of magnets for high target material utilization in a circular planar magnetron in accordance with the prior art.

Figure 6C:
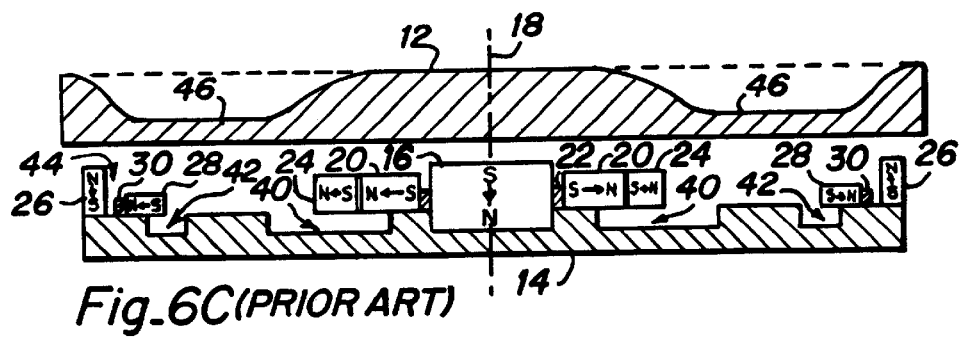
Figure 6B:
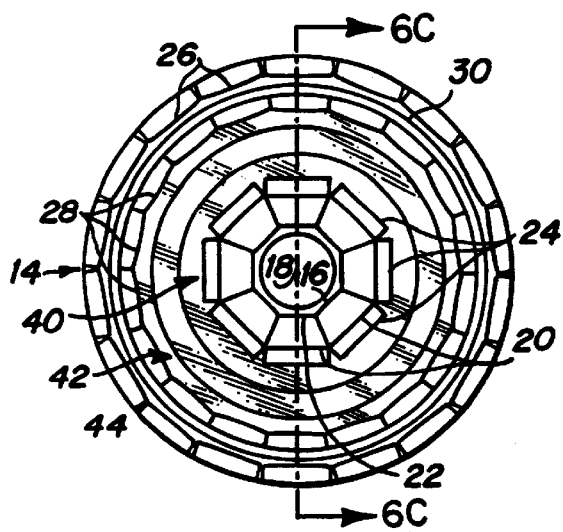

FIG. 6b is the plan view of the prior art arrangement of magnets shown in FIG. 6a.

FIG. 6c is a cross-sectional view of the prior art arrangement of magnets and the shape of the resulting sputtering groove taken along the line 6c—6c of FIG. 6b.

Figure 6D:
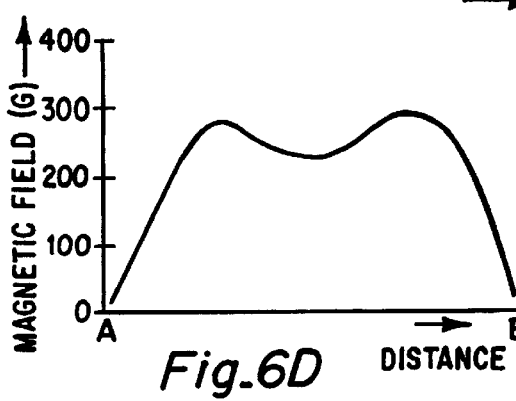

FIG. 6d is a radial plot of the horizontal component of the magnetic field for the prior art of FIGS. 6a–c.

Figure 6E:
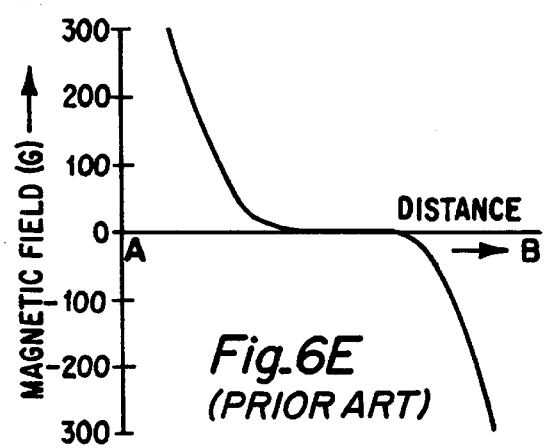

FIG. 6e is a radial plot of the vertical component of the magnetic field for the prior art of FIGS. 6a–c.

Figure 6F:
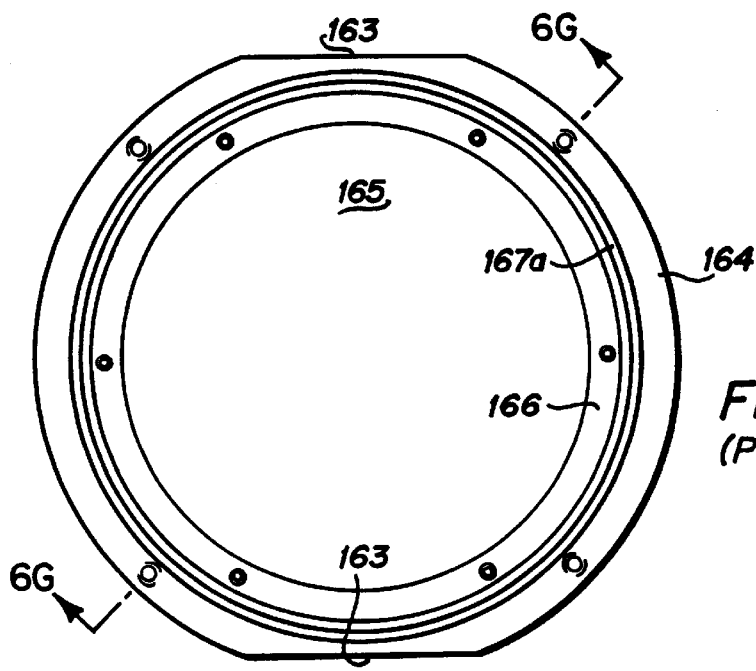

FIG. 6f is a top plan view of a circular planar magnetron used in one embodiment of the present invention.

FIG. 6g is a cross-sectional view of the circular planar magnetron of the present invention taken along the line 6g—6g of FIG. 6f and showing two embodiments for the magnetic arrangement; 1 for non-magnetic target material and for magnetic target material.

FIG. 6h is a radial plot of the horizontal component of the magnetic fields for the magnetron shown In FIG. 6g.

FIG. 6i is a radial plot of the vertical component of the magnetic fields for the magnetron shown in FIG. 6g.

FIG. 6j1 and 6j2 are plan and cross-sectional views of a magnetron mounting plate of the present invention, showing the method of introducing sputtering gas uniformly to all four magnetron positions.

Figure 6K:
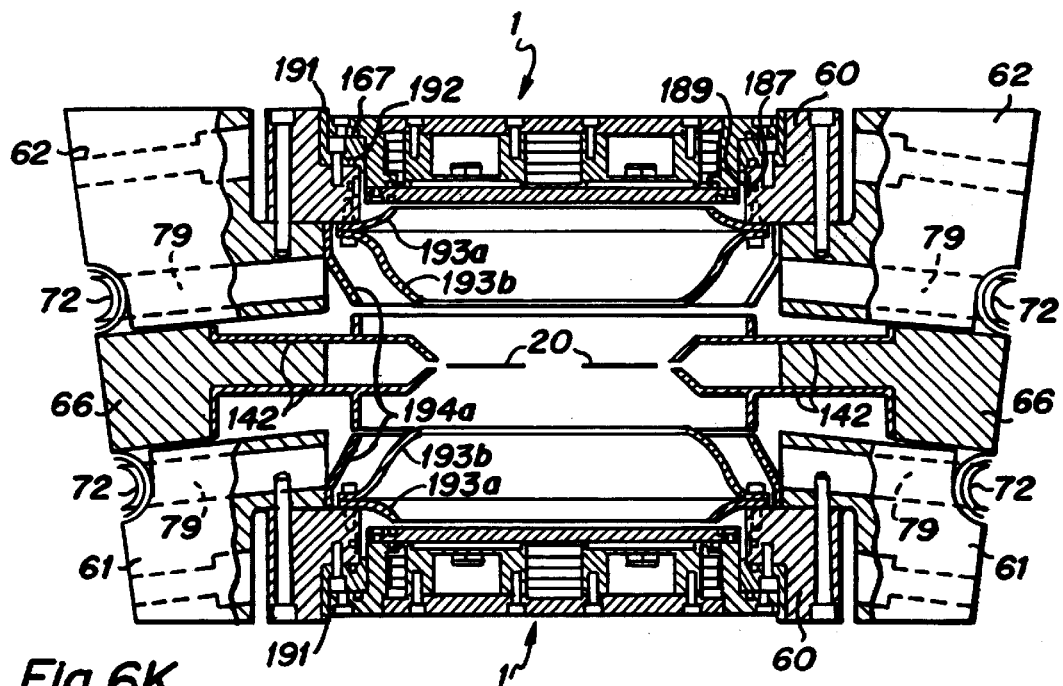

FIG. 6k is a cross-sectional schematic view in plan showing a processing station according to one embodiment of the present invention, and shown equipped with circular planar magnetrons and their associated shields for coating in the stationary mode.

Figure 7A:
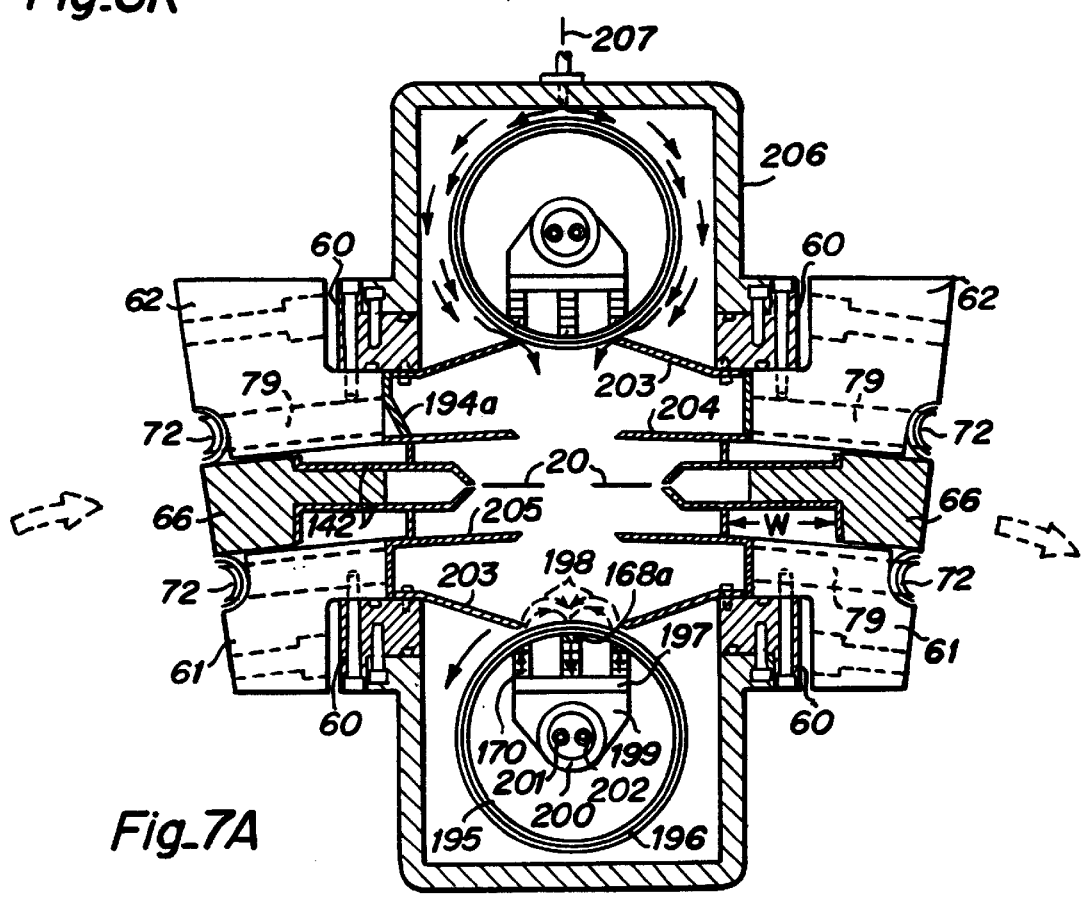

FIG. 7a is a schematic cross-sectional view in plan showing an embodiment of a rotary cylindrical magnetron and related shielding for a process station for coating in the pass-through mode of operation.

Figure 7B:
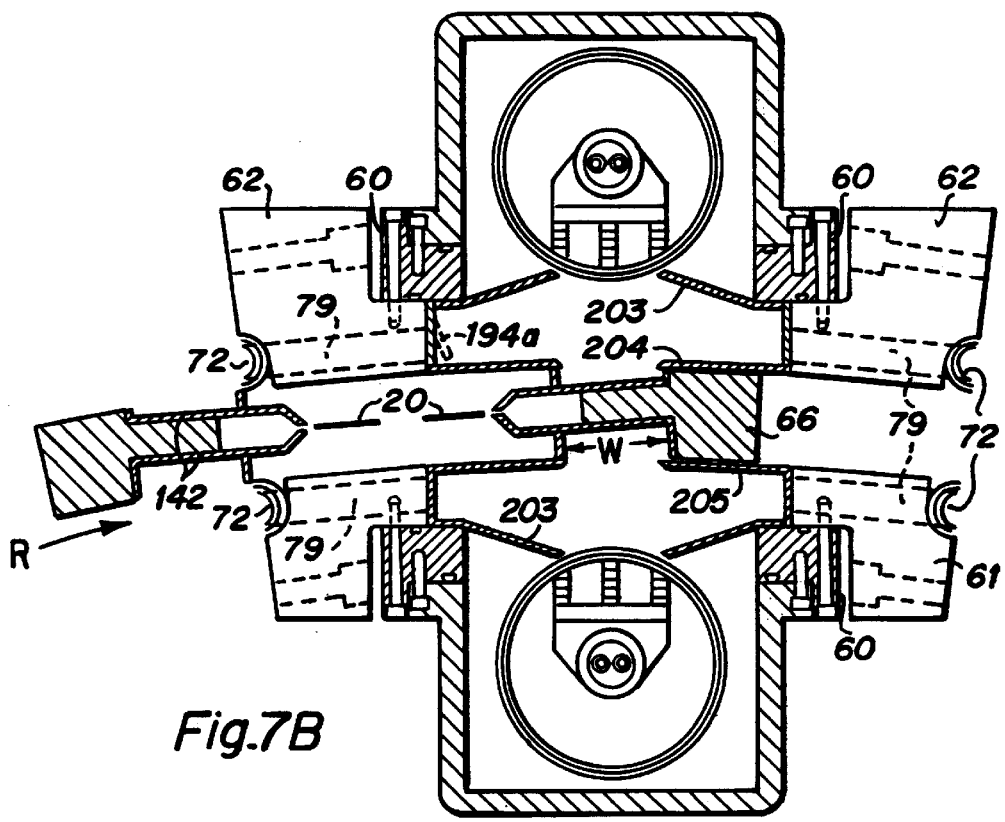

FIG. 7b is a schematic cross-sectional view in plan showing the initial position of the rotor of FIG. 7a for the start of sputtering in the pass-through mode.

Figure 7C:
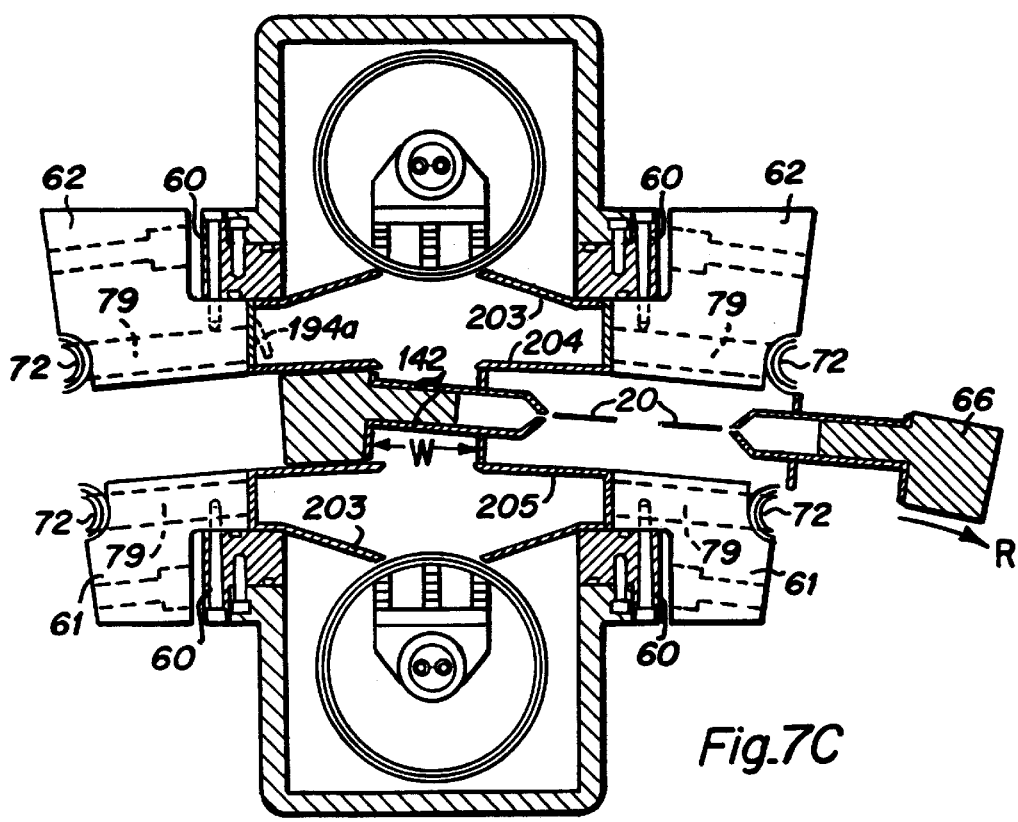

FIG. 7c is a schematic cross-sectional view in plan showing the final position of the rotor of FIG. 7a for the completion of sputtering in the pass-through mode.

DESCRIPTION OF THE PREFERRED EMBODIMENT

Figure 1A:
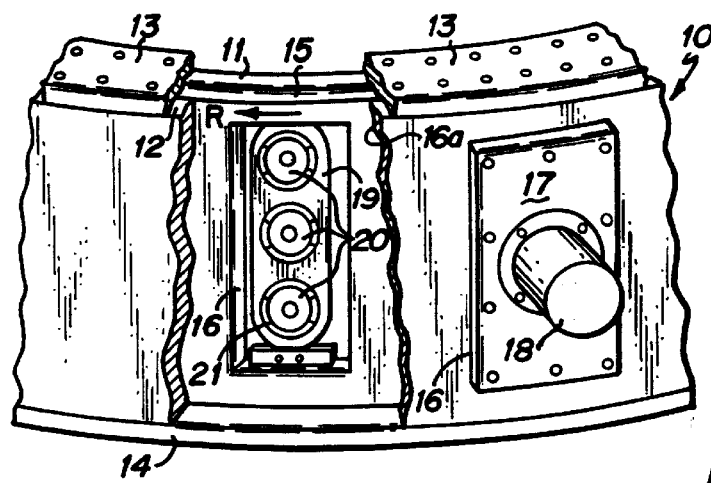
FIG. 1a is an illustration of a segment of a cylindrical carriage machine showing the basic design principle.
Figure 1B:
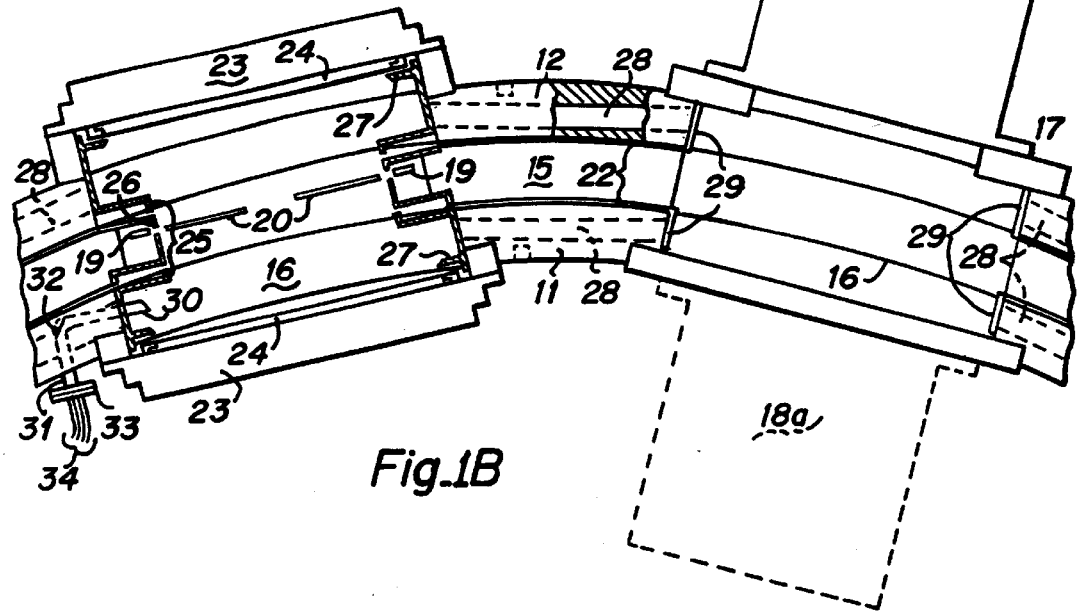
FIG. 1b is a schematic cross-sectional view taken in plan through the segment in FIG. 1a and illustrating a sputter processing station and an adjacent pumping station.
Figure 1C:
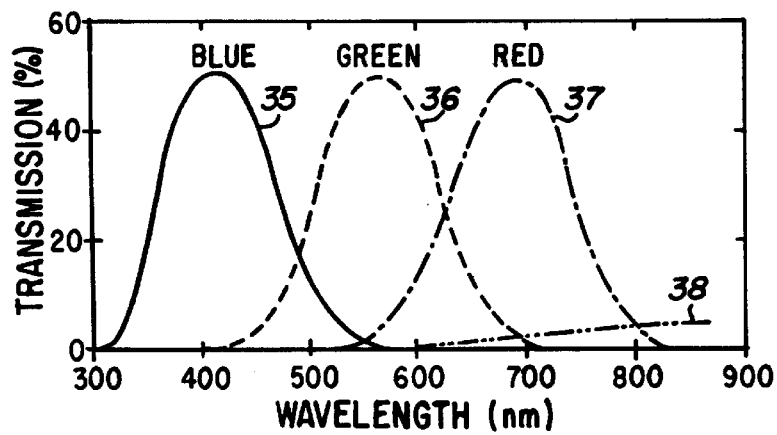
FIG. 1c is a graphical representation of transmission vs wavelength for commercially available colored glass filters to be used in an optical monitoring system.

While this invention may be embodied in many forms, details illustrating the basic design principles are shown schematically in FIGS. 1a–1c. A preferred embodiment of the design for coating magnetic memory disks is detailed in FIGS. 2a–5b and 6f–7c, with the understanding that the present disclosure is not intended to limit the invention to the embodiments illustrated.

The basic design principle of the machine is illustrated schematically in FIG. 1a. For simplicity only a short angular segment 10 of the total machine is described. A cutaway region 16a is included to more clearly allow the structure of the machine to be seen. A vacuum vessel is formed by inner concentric hollow cylinder 11 and outer concentric hollow cylinder 12 connected to top annular sealing flange 13 and bottom annular sealing flange 14. The internal volume formed by the inner and outer concentric hollow cylinders and the two sealing flanges is substantially filled by a third central concentric hollow cylinder 15 which can be rotated, R, with respect to the inner and outer cylinders by an appropriate drive mechanism (not shown). A number of rectangular openings 16 (stations) are cut through all three cylinders at several equally spaced radial locations around the machine. The openings in the inner and outer cylinders are sealed by standard plates 17 upon which are mounted vacuum pumps 18, and/or other processing equipment. Opening 16 in central hollow cylinder 15 carries a substrate holder mechanism 19 with, as an example, disk substrates 20 supported by thin "fingers" 21. As central cylinder 15 indexes around to sequential stations, various process steps are performed on the substrates.

FIG. 1b illustrates schematically a more detailed central horizontal cross-sectional view of an angular segment similar to that shown in FIG. 1a. Features in FIG. 1b which are common to those in FIG. 1a are indicated by the same numerals. The volume between inner concentric cylinder 11 "inner wall" and outer concentric cylinder 12 "outer wall" is substantially filled by central concentric cylinder 15 referred to as the "rotor". Clearances 22 between the rotor and the walls are small, being on the order of a small fraction of an inch. Values from about 0.025" to about 0.125" are the most useful for satisfying the tradeoff required between maintaining mechanical clearance during operation and providing isolation between openings or stations 16. As an illustrative example one station 16 is shown configured with magnetrons 23 and target material 24 for sputter coating disk substrate 20 which is supported by substrate holder 19. The walls of the station are protected from coating debris by changeable collection shields 25 attached to the fixed walls, and changeable shields 26 attached to the rotor. Shields 26 also serve to protect substrate holder 19 and restrict the coating flux largely to the area of disk substrate 20.

Shields 25 and 26 should preferably be made of metals with good heat conducting properties. For example, copper is a suitable material for shields 25 because it is an excellent heat conductor and allows easy attachment of water cooling lines. On the other hand, because shields 26 are not directly water cooled, aluminum may provide a cheaper solution than copper, although copper or other metals could also be used. Regardless of the construction material of the shields, their surface should preferably not be smooth. Roughening or dimpling the surface of shields 25 and 26 increases the surface area, thereby improving adhesion of the coating of the sputtered material. In addition, dimpling helps to minimize the stress in the deposited coating which, in turn, keeps such coating from flaking off prematurely.

Sputtering gas (usually argon) is introduced near the magnetrons, preferably near the region of magnetron anode 27. This gas is pumped away by the stations on either side of the magnetron sputtering station, which are configured with vacuum pumps. FIG. 1b indicates an adjacent station configured with vacuum pump 18. Sputtering gas flows through tube-like openings 28 from the magnetron station to the pumping stations. The throughput of the gas is controlled by adjusting either, manually or automatically, the cross-sectional area of openings 28 using valve structures 29. If extra pumping is required, pump 18a may be mounted across from pump 18.

This machine design may be applied at different scales to coat various types of substrates with a wide variety of coatings. Useful diameters of the cylindrical vacuum chamber range from a few feet to tens of feet. Diameters approaching 30 feet appear to be possible. The primary limitations being the difficulty of obtaining large rotary forgings, timely access to large metal turning machines to accurately form the cylindrical surfaces, and the availability of bearings large enough to adequately and accurately carry the central rotor. The use of multiple small bearings on the rotor is possible, especially in applications in which cleanliness is not of utmost importance. The machine can be readily configured to economically coat magnetic memory disks as well as silicon wafers, solar cells, flat panel displays, and a number of optical coating applications. In general the larger the diameter of the chamber the larger openings 16 could be made, or their number could be increased to provide additional process stations.

In principle each station 16 may be equipped with an optical sensing system, comprising, e.g., vacuum system optical feedthroughs, fiber optic relay pick-up cables, light separation filters or spectrometers, and a central processor or computer for processing and interpreting the light signals for monitoring and controlling the particular process. In practice the optical sensing system would be installed only on substrate processing stations; however, for ease of manufacturing and configuration flexibility, the vacuum system optical feedthroughs could be installed at every station. Optical signals may be transferred from the vacuum system to fiber optic relay pick-up cables in the following way. A first tube 30 extends through the shield 25 and into opening 16. A second tube 31 connects with the first tube 30 at an angle (e.g., 90°), with a mirror or prism 32 placed at the angle formed by the two tubes. These tubes would be placed between and so not to intersect the gas passageways 28. In a coating process chamber, the ratio between the length and the diameter of tube 30 is preferably large to minimize coating of mirror 32 during the coating process. A vacuum flange 33 is used to seal an optical window at the end of the tube 31. A plurality of (e.g., four) fiber optic cables 34 are used to pick up light from the interior of the process station via reflection from the mirror 32. The light is then relayed to separation filters or spectrometers, where electric signals are generated for the monitoring and control of the process.

Several monitoring optical schemes can be devised to employ the light signals transmitted via the fiber optic cables 34. As an example. FIG. 1c shows a schematic graph of the transmission (as percentages) vs. wavelength for a simple and effective arrangement of three, readily available, colored glass filters. Curves 35, 36 and 37 represent transmission responses for blue (B), green (G), and red (R) filters, respectively. Because B filters usually have some degree of red leak, as indicated by curve 38, adequate B filters should have as little red leak as possible. The bandpass of any filter (B, G or R) may be further tuned or shaped by, for example, stacking two or more colored filters with different individual bandpasses to create a desired composite bandpass. The red leak in many violet and blue filters may also be eliminated in this way. Preferably, an ultraviolet (U) filter may be added to the filter set, since plasma light sources have, in general, significant emissions in the ultraviolet region. A system including the U filter may require fused quartz or sapphire vacuum windows and high-quality quartz optical fibers to transmit the ultraviolet light from the sputtering system to the filter. Additionally, the photodiode detector used with the U filter may need ultraviolet enhancement. A system with the U channel is, therefore, more expensive than the basic B-G-R system.

In the particular embodiment depicted in FIG. 1b, three of the four fiber optic cables 34 may be used to transmit light through a set of three color filters. The output from the fourth fiber cable can be used without filtering as a "white light" channel. Typical silicon photodiodes having adequate sensitivity for wavelengths between, e.g., 300 nm and 1100 nm may conveniently be used to detect the light intensity from the output of each fiber optic cable.

The intensity ratios obtained by dividing the measured light intensities through the filters (i.e. B/G and G/R) may be related to the conditions of the light source, including, e.g., plasma conditions in a sputtering chamber, the status of quartz lamps in a heating station, or other process station parameters. These color intensity ratios are essentially insensitive to variations in the total light intensity, thus simplifying the mounting and alignment of the various components. Alternatively, the logarithm of the value of the light intensity through the filter, rather than the value of the intensity itself, is measured. In that case, the ratios of the intensities are obtained by taking the difference of the measurements. The non-filtered white light channel has generally much higher signal than the filtered channels and can thus be used to detect fast events such as arc discharges in the sputtering plasma.

Several variations of the aforesaid scheme are possible. For example, the use of additional simple filters or dichroic filters may be used to generate additional color intensity ratios. Similarly, very narrow bandwidth (i.e., interference) filters may allow the monitoring of individual spectral emission lines in the sputtering plasma. Diode arrays are readily available which can be used with a small diffraction grating to provide what is effectively a large number of filter outputs from a single white light fiber input. Regardless of the details of the particular optical system, the optical outputs may generate, through proper algorithms, real-time information relating to the process conditions in the processing station. Such information provides early warning of a developing problem and its approximate physical location, making it possible to correct such problems. Furthermore, such information can be incorporated and integrated into a highly responsive statistical process control system.

The optical monitoring system described above is capable of detecting several common problems occurring in the machine. Small vacuum leaks and water outgassing often cause degradation of coating properties. The incorporation of oxygen, water, or nitrogen into the growing film may result in severe degradation of the film properties. The color of the sputtering plasma is determined by the superposition of emission lines from the materials being sputtered and the emission lines of the argon sputtering gas. In general, the former are mostly in the blue region of the spectrum, while the latter are in the red region. Once the color ratios are known for a given argon pressure and deposition power setting in a clean system, very small levels of contaminants are detected as small changes in the color ratios. Gaseous contaminants generally shift the color ratios to the red, while metal contaminants (such as those originating from the target backing plate) generally shift the ratios to the blue. Optical monitoring of the substrate heater can detect a burned out lamp through an incremental change in intensity, or determine a degraded condition of a lamp through a shift in the color ratio. Advantages of optical detection include early warning of a developing problem, and its approximate physical location. This real time feed-back data can be incorporated and integrated into a highly responsive statistical process control system.

Figure 2A:
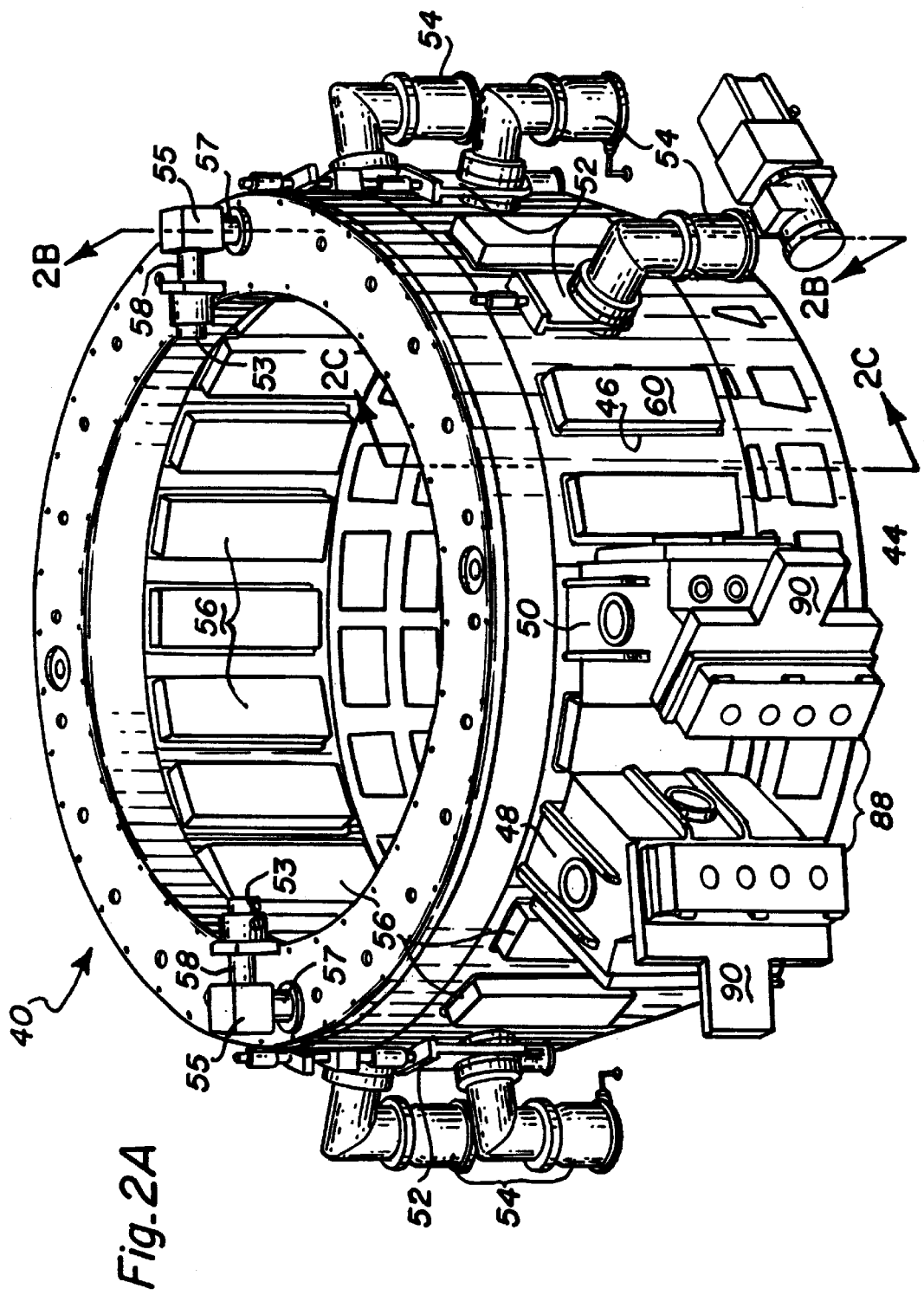
FIG. 2a is a three dimensional perspective view illustrating a cylindrical carriage sputtering system in accordance with the present invention.

FIG. 2a illustrates an example of the present invention in three dimensional isometric perspective. The machine as shown is a preferred embodiment for coating magnetic memory disks for computer hard drives. It should be understood that for coating other substrates silicon wafers or flat panel displays for example, the basic structure of the machine would not change but the configuration of the process stations could be different. Cylindrical carriage disk coating machine 40 comprises a main hollow cylindrical vacuum chamber device 42 with base supporting structure 44. Chamber device 42 contains a number of openings 46, which may be identical, and can be sealed by standard-sized rectangular blank-off plates 60. The standard plates may be configured as desired to support equipment for various processes. In this example, the machine is illustrated with 24 equally spaced, rectangular openings 46 and attached substrate load lock and transfer chamber 48, unload lock and transfer chamber 50 vacuum valves 52, turbomolecular pumps 54, and process stations 56. The process stations may be configured for substrate heating, cooling, etching, or coating deposition as dictated by the desired process. In this example pumps 54 are shown on both sides of each process station. While this is a convenient configuration for currently popular magnetic memory disk coating process setups, other configurations are possible and may be desirable for coating substrates that are now being developed for future use. For example, one could use a configuration with two or more process stations in a row before introducing the pumping. The machine is shown with two servo drive units 58, each of which consists of a servo motor 53, a speed reduction gear box 55, and a rotary vacuum seal 57. Additional servo drive units may be added to increase the speed at which the central hollow cylinder (i.e. internal cylindrical carriage not seen in this figure) can be indexed from station to station.

Chamber device 42 is constructed of suitable vacuum compatible materials of sufficient thickness to prevent unacceptable deflections when the air is removed and the force of atmospheric pressure (about 15 psi) is exerted upon the structure. For this example the preferred material for the construction of the chamber is aluminum with a thickness in the range of about 3 to 4 inches. Materials such as stainless steel or other metals could also be used. Additionally, any or all of the hollow cylinders could be fabricated from several pieces of joined flat stock to make a multi-sided polygon which would approximate the circular shape. The diameter of chamber 42 as illustrated in this example is between 10 and 11 feet, although it could be larger or smaller depending upon the number of openings 46 that are selected in the design for the particular coating process.

Figure 2B:
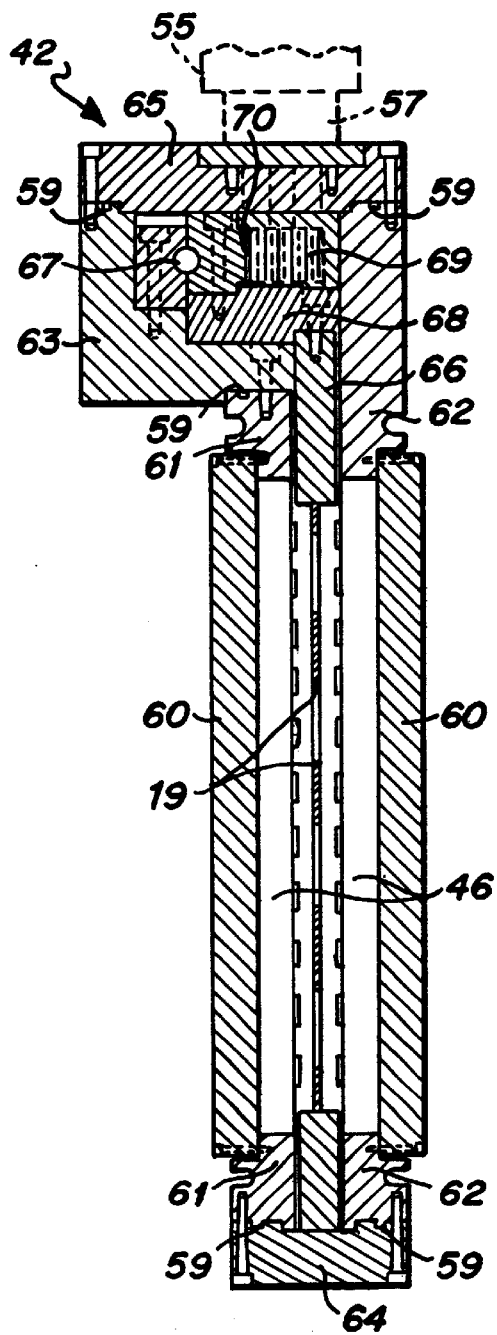
FIG. 2b is a vertical cross-sectional view of the cylindrical carriage sputtering system taken along the line 2b—2b in FIG. 2a and through a process station and through one of the drive assemblies.

A vertical cross-sectional diagram of hollow cylindrical chamber device 42 is shown in FIG. 2*b*. The view is taken through a process station illustrated here for simplicity with standard blank-off plates 60 that seal off openings 46. As discussed above, plates 60 may be configured with a variety of process equipment or pumps. The cylindrical vacuum chamber device 42 comprises inner hollow cylinder 61, outer hollow cylinder 62, drive bearing support ring 63, bottom annular flange 64, and top annular flange 65. These parts are sealed together with vacuum O-rings held in O-ring grooves 59 machined into the parts. Central hollow cylinder 66 (the rotor) substantially fills the volume between hollow cylinders 61 and 62, and carries substrates for coating. Central hollow cylinder 66 is attached to the outer race of turntable bearing 67 by way of transfer annular ring 68. Drive unit 58 (not shown in detail for simplicity) indexes (turns) central hollow cylinder 66 and transfer ring 68 from one process station to the next by applying rotational motion to drive pinion gear 69. The latter engages a large gear 70, that is cut into the outer race of bearing 67. For a machine of this size, bearing 67 weighs between 1000 and 2000 pounds if made from conventional bearing steel.

Figure 2C:
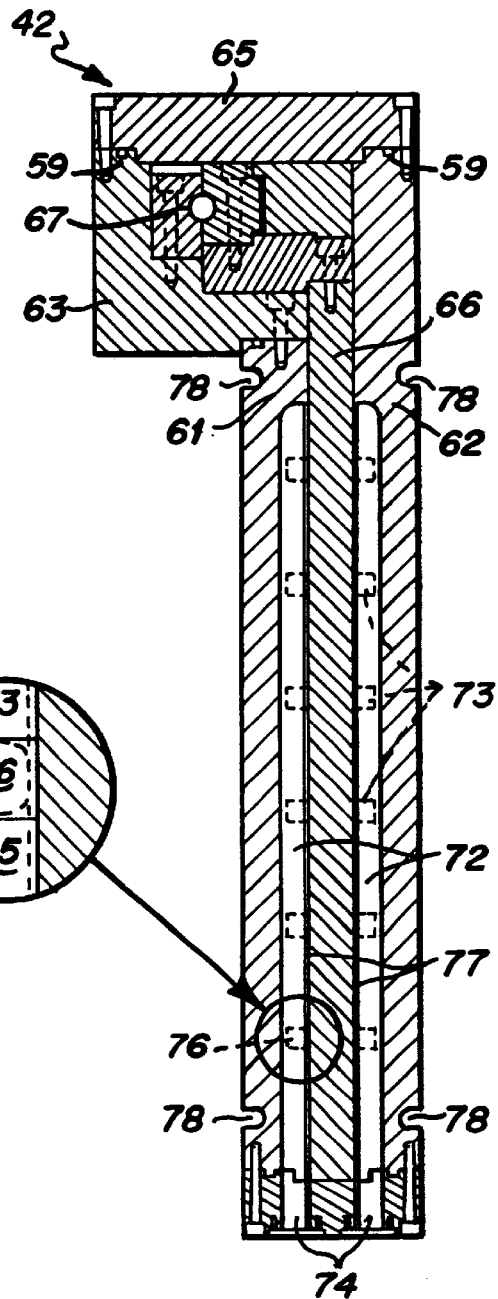
FIG. 2c is a vertical cross-sectional view of the cylindrical carriage sputtering system taken along the line 2c—2c in FIG. 2a and through a point midway between stations to illustrate the process gas flow passageways.

A second vertical cross-sectional diagram of hollow cylindrical chamber 42 is shown in FIG. 2*c*. The view is taken between process stations. Inner and outer cylinders 61 and 62 contain vertical holes 72 which intersect sputtering gas passageways 73 at right angles. Vacuum feedthroughs 74 allow the rotation of rods 75 (see insert view) that are mounted in vertical holes 72. Rods 75 have holes or orifices 76 that align with gas passageways 73. When gas passageways 73 and holes 76 are aligned maximum gas flow from a process station to a pumping station is achieved. When rods 75 are turned so that holes 76 are at 90 degrees to gas passageways 73 the minimum amount of gas flows out of a process station and into a pumping station. This minimum level of gas flow is controlled by the clearances 77 between inner and outer walls 61 and 62 and central rotor 66. In the present example this clearance is about 0.060 inches and varies a few thousandths of an inch with the temperature of the structure. This unique combination of passageways and variable orifices forms an adjustable system of throttling valves through which the uniformity and level of flow of sputtering gas may be accurately controlled. The machine walls can be heated or cooled by way of grooves 78 that surround the top and bottom of cylindrical walls 61 and 62. These grooves hold thermally potted tubes or pipes through which heating or cooling water, or other heat transfer liquid, is circulated to allow adjustment of the diameter of the machine, and therefore the size of clearances 77, through controlled thermal expansion and contraction.

To further clarify the structure of the machine, FIG. 2*d* shows a three station segment of the machine in planar cross-sectional view. Elements in common with elements shown in FIGS. 2*a*–2*c* are labeled with the same numerals. The substrate holder and shields are not shown for simplicity. Openings 46 are, for convenience and simplicity, shown covered by standard blank-off plates 60. They would normally carry process equipment and pumps. Inner cylinder 61 and outer cylinder 62 can be formed from flat plates (one per station) to approximate the circular shape of the machine. Solid forged rings are then welded to both the top and bottom of each cylinder to complete the structure and to provide unjoined surfaces for O-ring sealing grooves. The inner surfaces 75 of cylinders 61 and 62 along with rotor 66 are machined accurately round to maintain the tight clearances 77 required for station-to-station isolation. Sputtering gas flow 79 from a disk coating station proceeds primarily through gas passageways 73 into a pumping station on either side. The flow of gas is controlled by adjusting the cross-sectional area of passageways 73. This adjustment is accomplished by turning rods 72, which are attached to vacuum feedthroughs 74. The positioning of rods 72 may be done manually to select a static operation position. or the positioning may be done by automatic feedback control to maintain a constant value of a processing parameter, for instance the sputtering gas pressure.

Disk substrates are loaded into and unloaded from the machine by robotics means. FIG. 3*a* shows a planar view of the load/unload region of the machine. The load and unload locks 43, 45 and transfer chambers 47, 49 are generally shown at 48 and 50 respectively, as in the 3-dimensional view of FIG. 2*a*. This assumes that the rotor 66 will rotate in the direction "R" as indicated. These chambers are attached to the main machine at two process stations 81 and 83 as indicated in the figure, with a blank work station 85 in between. The chambers 48 and 50 are mirror images of each other and are angled with respect to each other such that a single load/unload robot 80 may easily access both chambers within its operating envelope 82. Disk substrates 84, four cassettes of 25 disks each, may be conveniently positioned as shown within envelope 82, or other positions within the envelope may be chosen. The cassettes 91 would be indexed past the robot on a loading/unloading dock 89, preferably including a conveyer means "C". Robot 80 has an end effector 86 which supports four equally spaced mandrels 87 with 25 transverse grooves each. Those skilled in the art realize that the lock and transfer chambers require appropriate vacuum pumps (such as displacement. roots blower, cryo, and turbomolecular types) for their operation. For clarity these standard items are not shown in the figure.

To load the machine, the robot 80 swings around to the disk source position $P_1$ and inserts the mandrels 87 simultaneously into the central holes of disk substrates 84. All 100 disks are lifted vertically out of the cassettes 91, and as the robot swings slowly around toward entrance load lock 43, end effector 86 is rotated 90 degrees to a vertical position. Each mandrel is rotated in an opposite direction to eliminate any skuffing between the mandrel and the inner edge of the disk. With slit valve 90 closed and door 88 open, effector 86 moves into position $P_2$ and the disks are placed into four vertically oriented holders 92 in load lock 43. Door 88 closes and load lock chamber 43 is pumped down to low pressure. In order for the pumpdown to proceed slowly without stirring up debris particles which would contaminate the disks, the volume of air to be pumped out of chamber 94 is limited to just the cylindrical volume of the four sets of disks. This is accomplished by providing a block 95 of appropriate material (aluminum for example), which essentially fills the volume of chamber 94, drilled with four cylindrical holes 93 that are somewhat larger in diameter than that of the substrate. Holders 92 are preferably cylindrical sleeves 97 that fit into the drilled holes 93 as changeable inserts. In this way a dirty holder may be easily replaced, or alternative materials may be used for different substrate materials, without changing the volume limiting block itself. Additionally, in this system the original process cassettes 91 containing the clean disks to be coated are left at position 84, and are subsequently refilled with coated disks that are unloaded from the machine. The process cassettes, if they were to be introduced into chamber 47, would have carried in a heavy load of moisture residues which would significantly lengthen the pumpdown time and contaminate the vacuum.

When the pressure in load lock chamber 94 approximately matches the operating low pressure in transfer chamber 47, slit valve 90 opens and transfer robot 98 removes the disks from holders 92, rotates around to the machine entrance location 96, and places the disks in walking (indexing) disk holder 100, disposed to extend into the cylinder opening 101. This holder is driven by servo motor and gear box 102 through a cam which determines the pattern of motion. It maintains a disk in the position in holder 100 which is nearest to rotor 66, i.e., the last or end position. Additional robots (not shown in this figure) are mounted on the opposite (inner) side of chambers 48 and 50. These take the disks from the four vertically separated end positions and transfer them to the disk holder (not shown) on the rotor 66. Unload is accomplished by an opposite set of steps to the load sequence, performed through unload lock 50. Specifically, and additional robot (not shown) removes the disks from the rotor 66 and places them in the holder 103, and a robot 105 disposed in chamber 49 removes them and transfers them to holders 92 in exit-lock 45. Robot 80 then rotates into position $P_3$, removes the substrates and transfers them to empty cassettes 91.

A vertical cross-sectional view of the load system is shown in FIG. 3b. Elements common to those in FIG. 3a. are labeled with the same numerals. The main chamber of the machine is omitted for clarity. Chamber 104, mounted on the inside of inner cylinder 61 and opposite to transfer chamber 48, contains a four mandrel robot 106 whose motion is controlled by servo motors attached at positions 108. Robot 106 selects the end disks from walking disk holders 100 and places them in positions 110 in the disk holder (not shown) on the rotor 66.

Those skilled in the art will recognize that variants of the above described system are possible without violating the spirit or scope of the present invention. For instance, entrance transfer chamber 47 (FIG. 3a) and its mirror image exit transfer chamber 49 could easily be combined into a single chamber and the invention would still work, although with the disadvantage of a slightly larger vacuum volume. Also, entrance load lock 43 and its unload lock mirror image 45 may be oriented parallel to each other rather than tilted at an angle, as illustrated in FIG. 3a. However, such a layout would require two robots 80, one dedicated to load and the other to unload. While more expensive (due to the cost of the additional robot), the system would still work in essentially the same way. Other variations of a similar nature could no doubt be readily implemented by those skilled in the art.

One embodiment for holding disk substrates in the rotor cutout is shown schematically in FIG. 4a. Four identical holders 112 are arranged in the rotor cutout and each one is attached to thermally insulated supports by four individual adjustment screws 114. Alternatively, the attachment may be made by the three kinematic points 114a. This allows the plane of each disk holder aperture to be independently aligned with respect to the robotics loader. The four holders may also be combined into a single holder with four apertures and adjustment screws at the top and bottom only. More precision is needed for this design to insure coplanarity of the four apertures. Disks 20 are held in a shallow slot 116 at the bottom of the aperture, and the disk need not contact slot 116 along its entire length, e.g. two or three points may be sufficient. A slot 118 with a clearance somewhat more than half way around the disk allows for loading and unloading, which is accomplished with grooved mandrel 120. An advantage of this type of substrate holder is its simplicity and versatility; however, it may not be stable against high acceleration of the rotor, and it may not be adequate for very high substrate temperatures.

An improved substrate holder is shown schematically in FIG. 4b. It is attached to the rotor cutout by four bars 121 at pivots 122a, and to the holder at pivots 122b. Bars 121 may be made of thermally insulating material, or the holder otherwise thermally insulated from the rotor. The holder is made preferably of low expansion material (molybdenum for example) in two sections 124a and 124b with circular apertures 126 which are slightly larger than the substrates. Rotation of bars 121 around pivots 122a in the directions indicated by the heavy arrows and into the positions indicated by the dashed lines, serves to separate sections 124a and 124b far enough for the robot to place a substrate into each aperture. Sections 124a and 124b may be spring loaded to return them to the closed position and to allow for thermal expansion of the disk when it is heated.

Further details of the aperture and holding means are shown in FIG. 4c. Substrate 20 is held by three or four (illustrated) thin "fingers" at positions 128 made of a high temperature material like tungsten. The tips of the fingers have a small "V" notch or rounded notch that fits and grips the outside diameter of the disk. Details of the finger construction are shown for one position. An insert 130 made of a thermally insulating material carries the mounting portion 132 of finger 128 and is secured by screw 134. A small screw or an auxiliary small wire (not shown) may be used to provide enough electrical conductance to allow the application of a bias to the substrate while effectively blocking the conduction of heat away from it.

FIG. 4d shows an alternative embodiment for holding disk substrates. It has the distinct advantage of enabling good coating uniformity to the outside edge of the disk, without interference of the coating flux by shadowing from the "fingers" or other supports. The figure illustrates a rotary knife-edged wheel 136 mounted in a recessed pocket in section 124b and secured by screw 138. The insert shows a cross-sectional view through A—A to better illustrate the structure. Disk or wafer substrate 20 is provided with a "V" groove 139 around its outer edge into which wheel 136 fits. The groove in the substrate prevents coating flux from reaching the contact edge of wheel 136. The recessed pocket protects most other areas of wheel 136 from being coated. As a result, clean areas of the knife-edged wheel can be rotated toward the disk for extended use before maintenance changes. In order to obtain thermal isolation of the disk, the structure can be built into a block 140 of heat insulating material, similar to that described in the previous figure.

FIG. 5a shows a schematic cross-sectional view through one of the substrate positions, illustrating a processing station configured for heating. The figure depicts one of the three sections depicted in FIG. 2d with like numerals indicating like elements. Rotor 66 carries substrates 20 in a substrate holder 19, and sets of replaceable shields 142, which protect both the rotor and substrate holder from coating flux. Plates 60 are provided with smaller plates 144 which are fitted with heating devices 146a and 146b (four per side). Each substrate has a pair of heating devices 146a and 146b including a cylindrical shield 148 attached to a base plate 150 and cooled by water (or other fluid) circulating through tubes 152. Quartz lamps 154 are attached to base plate 150 and form an annular array approximately the size of substrate 20. Each base plate 150 is attached to a shaft 156 which penetrates a plate 144 and extends through a vacuum feedthrough means 158.

The heaters may be moved towards and away from the substrate as indicated by the heavy double ended arrows. Device 146a is illustrated in the retracted position which allows rotor 66 to move to the next station without hitting shield 148. Heating lamps 154 are turned off while the devices are in this position. When substrate 20 is being heated in the static deposition mode, the heating devices are advanced toward the substrate as illustrated by 146b, and stopped just short of actual contact. The heat from the lamps is directed at the substrate, and the cavities formed by shields 148 and base plates 150 effectively confine most of the heat to the substrate. Shields 148 and base plates 150 are preferably made of copper, nickel, or stainless steel and are plated with a good heat reflecting metal like gold, to improve the heating efficiency and uniformity by multiple reflections. As those skilled in the art will recognize, other workable variations can be are readily accomplished. For example, base plate 150 could be rectangular and carry all four cylindrical shields 148. Only top and bottom shafts 156 would be required to mount the plate and allow the motion required for its operation.

When heating devices 146a and 146b are in their operating positions, there is very little loss of energy by radiation from the water-cooled shield enclosures 148. This arrangement thus provides very efficient heating of the substrate but not the surrounding structures. The small amount of scattered radiation into the interior of the chamber is sufficient for operation of the optical monitoring system described above but not depicted in this figure. The latter can be used to determine, e.g., whether a heating lamp is burned out, or whether its output is deteriorating. The intensity ratios of the color filters may be used to detect the latter condition. Very high processing temperatures (approximately 1,000° C.) can be reached with this heater arrangement, thereby making this coating machine compatible with advanced substrate and overcoat materials (e.g., SiC).

The process for disk coatings includes a thin protective layer of carbon deposited over the magnetic storage layer. Hydrogen is reactively combined with the carbon to form a harder overcoat usually referred to as "diamond-like" or "hydrogenated" carbon. While the disk is heated to achieve improved properties in the magnetic storage layer, it must be cooled to optimize the incorporation of hydrogen into the carbon. FIG. 5b is a schematic cross-sectional view of a process station configured for cooling the substrate after the deposition of the magnetic storage layer. As in FIG. 5a, elements corresponding to those in FIG. 2d are labeled with like numerals.

Shafts 156 and vacuum feedthroughs 158 may be similar to those shown for the heater in FIG. 5a. Cooling platens 159a and 159b are substituted for the heating elements and channels 160 are provided in the shafts for the introduction of a cooling gas, preferably helium, using common gas flow control techniques and equipment. Platen 159a is illustrated in the retracted position to clear rotor 66 when it turns. Note that the platen is shown with a flat surface facing toward substrate 20. Platen 159b is illustrated in the operational position proximate to substrate 20. The surface of this platen is recessed with respect to an annular raised ring 157 at its edge. Channels 160 connect to annular openings 161 built into the platens. A series of tiny holes or orifices 162 cover the circular area over openings 161, which in turn approximately matches the circular area of substrate 20.

With the platens in the operational positions, cooling gas at a pressure of about 20 torr is injected through channels 160 and out of orifices 162. In the preferred configuration of platen 159b, volume 163 becomes a region of relatively high pressure of the cooling gas, which leads to a high cooling rate of substrate 20. The cooling gas flows out of volume 163 through the restricted annular opening of approximately 0.010 inches formed between the substrate 20 and the raised ring 157 on the platen, as indicated by the heavy arrows. While the cooling gas is flowing, valves 72 are substantially closed forcing the gas to flow through narrow passages 77. This keeps the pressure of the cooling gas even higher for more efficient cooling. Before rotor 66 steps to the next position, and after the cooling gas is turned off, valves 72 open to flush the chamber.

Current static coating machines use circular planar magnetrons to coat individual disk substrates, while the pass-through machines use rectangular planar magnetrons which are typically 4 to 8 times longer than they are wide. Prior art designs for circular planar magnetrons concentrate entirely on improving target utilization. An example from Manley U.S. Pat. No. 5,262,028 is shown in FIG. 6a. A dual ring of magnets at the center and at the edge of the circular structure along with circular cutouts in the base pole piece results in magnetic field lines being largely parallel to the target surface.

FIG. 6b shows a plan view of the design, while FIG. 6c is a cross-section that shows the broad flat shape of the sputter erosion groove (46). While this is desirable for efficient target utilization, a circular substrate registered across from the target suffers a radial dependence of coating thickness and properties, which is undesirable from the standpoint of (for example) magnetic recording. It should be noted that the analogue of this design for rectangular planar magnetrons improves target utilization, but gives uniform coatings because the disk substrate is moved at constant rate across the coating zone thus integrating over the spatially non-uniform deposition pattern. A similar result for rectangular planar magnetrons is obtained by the designs shown in PCT/US92/00722.

The shape of the sputtering groove is dependent upon the shape of the magnetic field above the target plate. This is illustrated further by Arita in U.S. Pat. No. 4,964,968 where electromagnets, rather than permanent magnets, are used to create the magnetic fields for sputtering. FIG. 6d shows the prior art shape of the horizontal component of the magnetic field above the target measured radially from the center of the circular magnetron. It approximates the ideal shape of a flat field with only a shallow dip in field strength near the half radius point. The field value in the dip is about 250 gauss, which is adequate for sputtering at normal pressures. The corresponding vertical component of the field is shown in FIG. 6e. Note that over the region in FIG. 6d where the horizontal component of the field dips, the vertical component substantially goes to zero. Under these field conditions the sputtering groove will develop where the vertical component of the field is near zero and hence it will be broad and flat as previously shown in FIG. 6c. Clearly more than one magnet arrangement can lead to the same end result for the shape of the fields and therefore the shape of the sputtering groove.

In the present invention, circular planar magnetrons are used for deposition of the coatings in the static mode of operation. FIG. 6f illustrates schematically a top plan view of the magnetron, according to one embodiment. The main body of the magnetron 164 includes a mounting flange which has opposing flats 163 for nesting several together in a row. O-ring groove 167a is provided for the seal to the vacuum chamber. Target clamp ring 166 secures target 165 to the top mounting surface. The magnetron body can be made from copper or stainless steel, although stainless steel is preferred if welding is used in the construction.

FIG. 6g shows a detailed schematic cross-sectional view which includes two embodiments 1 and 2 of the circular magnetron used in this invention. One embodiment is illustrated on each side of line A—A, and each is symmetric about line A—A. Embodiment 1 is a single-piece body construction most useful for the deposition of non-magnetic materials. Embodiment 2 is a welded body construction useful for both magnetic and non-magnetic materials. The primary components and features of embodiment 1 are the body of the magnetron 164, target material to be sputtered 165, target clamp ring 166, grooves for target o-ring seals 167b, magnetically permeable top pole pieces 168a, bottom permeable spacer pole pieces 168b, rear pole piece 169, stacks of magnets 170, trim magnets 170a, a cavity 171 for holding field shaping trim magnets, and water cooling cavity 172. Two tubes or pipes (not shown) enter cavity 172 from the back of the device to allow water to flow in and out. The magnetic poles are shown as stacks of smaller individual magnets with arrows indicating the direction of magnetization. Typically the magnets would be the high energy density type made of neodymium-iron-boron or samarium-cobalt. While larger solid magnets would work equally well, the stacks of individual magnets are convenient for varying the total field strength by adding or subtracting a single magnet to or from the stack, and for use as trim magnets. The outer pole and trim magnets are rectangular in cross-section and vary in length from about 0.5 inches to one inch. The center magnets are round disks that are about an inch in diameter.

The stacks of magnets 170 by themselves would produce an arched magnetic field in the region above the target, and the sputtered groove which forms in the target would substantially have the inverse shape of the magnetic field. This is the classic situation which yields both poor target utilization and non-uniform coatings. These phenomena are well known to those skilled in the art. Prior art improvements use trim magnets or magnetic material to flatten the magnetic field to improve target utilization by producing groove shapes similar to that illustrated in FIG. 6c. In the present invention, trim magnetic structures are provided which give the groove shapes schematically shown by dashed lines 165a and 165b in FIG. 6g. For nonmagnetic target materials trim magnet structure 170a yields groove 165a, while for magnetic target materials trim magnetic structure 170b produces a similar groove 165b. They can be described as two concentric slightly overlapping sputtering grooves with the inner groove being substantially shallower than the outer groove. The grooves are easily tuned in by moving the trim magnets slightly around the indicated positions. After the optimum position is found, a machined ring of aluminum or other non-magnetic material, with the cross section of cavity 171, is made to hold the trim magnet structure in place. This design has somewhat poorer target utilization than the prior art structures; however, it yields coatings on round disk substrates of significantly improved radial uniformity.

Embodiment 2 is shown configured for a magnetic target. Many features are similar to those of embodiment 1 and common elements are labeled with like numerals. The magnetron body for embodiment 2 consists of two parts 164a and 164b, which are joined together by welding them to annular pole piece 173a. The center of 164b is filled by welding in pole piece 173b. Magnetic pole pieces 173a and 173b provide improved magnetic coupling paths for the flux from magnets 170 to the target. This feature is especially advantageous for magnetic targets since it eliminates the high reluctance (i.e. non-magnetic) gap in the magnetic circuit that occurs for embodiment 1 between top pole pieces 168a and target 165. Trim magnets 170b are substantially different from trim magnets 170a for embodiment 1 because the target is magnetic. However, this configuration is necessary to preserve groove shape 165b which gives uniform coatings. Embodiment 2 can be configured for non-magnetic targets by replacing structure 170b with 170a and removing the bottom magnet 170 from each stack and replacing it with bottom spacer pole pieces 168b.

The shape of the sputtering groove can be understood from the shape of the magnetic field above the target. FIGS. 6h and 6i illustrate respectively, measurements of the horizontal and vertical components of the field for the configuration of embodiment 1 in FIG. 6g. Distance is measured radially from the geometrical center of the magnetron to its outer edge. Note that the horizontal field has a distinctly large dip 175 in the middle compared to the prior art in FIG. 6d. In addition, the peak value of the horizontal field nearest the center 176 is less than the peak field 177 near the edge, but both values are relatively large, greater than 300 gauss. The value of the field in the dip is less than 100 gauss. This low value is an intentional part of the design, and is intended to largely quench the sputtering there. The vertical field plot in FIG. 6i shows three distinct zero values at positions 178, 179, and 180 as opposed to the prior art design of FIG. 6e. Normally, a deep groove would develop at zero position 179, but in this design this is substantially prevented by the corresponding low value of the horizontal field at position 175. Sputtering grooves therefore develop at zero positions 178 and 180 where the horizontal fields are relatively high. The maxima in the vertical field at 181 and 182 are of sufficient magnitude, e.g. about 200 gauss, that sputtering near the central zero at 179 is further reduced. The groove depth at position 180 is greater than that at 178 because the horizontal field at 177 is higher than that at 176. This magnetic design produces sputtering groove 165a in FIG. 6g, which gives substantially more uniform coatings than the prior art but necessitates some sacrifice in target utilization.

FIG. 6j1 and 6j2 respectively, show plan and schematic cross-sectional views of blank-off plate 60 configured for the mounting of the magnetrons previously described. Four holes 183 are cut completely through the plate and counter bored to hold the magnetrons on electrical insulating rings. To avoid confusion these holes are shown dashed in the cross-sectional view, and will be readily understood in the following illustration. The sputtering gas, normally argon, enters the process chamber after passing through the usual regulators, valves, filters and flow controllers (not shown) by way of tube 184. The arrangement is such that the total path length from junction tee 185 to each of the four magnetrons is the same. Arrows indicate the flow of gas to a representative magnetron. Internal passages 186 connect to semi-circular passages 187 which terminate at 188. Circular ring 189 constitutes the inner wall of passage 187 and may contain a number of small apertures to provide uniform injection of gas around the sputtering target, or the ring may be made of a sintered material (stainless steel for example) that allows continuous seepage of gas around the target. In FIG. 6j1, ring 189 of the right most depicted hole 183, is shown with four holes 190 quadratically spaced with respect to internal passage 186. This is considered to be the minimum practical number, with larger numbers of holes preferred.

FIG. 6k is a schematic cross-sectional illustration showing an embodiment of the new magnetron designs in a stationary deposition mode of the present invention. As an example, a single process station, like the central station of FIG. 2d, is shown with blank off plates 60 configured with circular apertures, as described in FIG. 6j, to hold the magnetrons of embodiment 1. Magnetron embodiment 2 is mounted essentially identical to embodiment 1 and is therefore not illustrated separately. Structural elements which were previously discussed are labeled with the same numerals. The magnetron is mounted in the aperture of plate 60 by the use of an electrical insulating ring 191. This ring may be made of delrin, nylon, ceramic, or other appropriate machinable electrical insulator material, and it must have a smooth surface to seal against the O-ring in groove 167 in the magnetron body. In addition, another O-ring groove must be provided to seal insulator ring 191 to plate 60. This groove, 192, may be machined into insulator ring 191 as shown, or it may alternatively be machined into plate 60 at the adjacent location.

Shields 193a and 193b are circular structures, with cross-sections as indicated, that contain concentric apertures centered upon each of the four magnetrons of this example. Shields 193a serve as the anodes for the magnetrons and are identical side to side. Shields 193b are very similar except for slightly different lengths from side to side in order to miss rotor 66 when it rotates. Shields 193a and 193b are held in place by bolts which thread into plate 60. Therefore, these shields come off with the magnetrons when plate 60 is removed for maintenance. Along the sides of the process station opening are elongated rectangular shields 194 and 194a that are provided with small shielded apertures or bent tabs aligned on gas passages 79. Note that shield 194 is wider than 194a, therefore they are not interchangeable side to side. Argon sputtering gas enters the magnetron region as described in FIG. 6j and flows around passage 187 behind and partially formed by ring 189 until it escapes through the small holes 190 of FIG. 6j that are formed in ring 189.

For the pass-through mode of sputter coating disk substrates, the above described line of four circular magnetrons on each side of the process station may be replaced with a single rectangular planar magnetron of conventional or improved (i.e. Manley U.S. Pat. No. 5,262,028) design. The problem that exists with these designs is that the eroding target material, the "racetrack" groove, causes a change in geometry which in turn results in a change in process conditions, particularly changes in sputtering voltage and/or current, which changes the magnetic properties of the disk. If the target surface shape remained unchanged during its lifetime (i.e. no groove formation), the process parameters could be stabilized over target lifetime. This problem can be overcome by the use of a properly designed cylindrical rotary magnetron, which by virtue of its rotation during operation, will eliminate the formation of a groove and stabilize the process by keeping the surface shape of the target cylindrical over its lifetime.

FIG. 7a illustrates an embodiment of a cylindrical rotary magnetron for the pass-through mode of sputter coating disk, wafer, of flat panel substrates. Elements of the process station which are common to and have the same function as those previously referred to are labeled with like numerals. The differences between the pass-through arrangement of FIG. 7a and that shown in FIG. 6k for the stationary deposition mode consist of a change in the type of magnetron used, a change in the shield on the magnetron, and a change in the way sputtering gas is injected.

The type of magnetron used for the pass-through mode of the present invention is designed to coat planar substrates. It is different from of the rotary cylindrical style for coating non-planar substrates described by McKelvey in U.S. Pat. No. 4,445,997 issued May 1, 1984. The cross-sectional view of the present magnetron is shown in FIG. 7a. It consists of a cylindrical backing structural tube 195 which carries a concentric tube of target material 196. Both tubes are of constant diameter over their entire lengths of about 30 inches for this example of coating 4 or more substrates in a linear vertical array. Tube 195 is sealed at its top and bottom and contains stacks of magnets 170 and pole pieces 168a which are functionally similar to those described in FIG. 6g. Back pole piece 197 corresponds in function to pole piece 169 in FIG. 6g. Together these elements comprise a simple rectangular planar magnetron magnetic structure, modified to be contained within the cylindrical geometry of tube 195, which forms a conventional arched field 198 that determines the sputtering racetrack. Mounting piece 199 attaches the magnetic structure to central axle 200. The latter allows rotation (indicated by the arrow labeled R) of tubes 195 and 196 with respect to the magnetic structure which is held fixed. Small tubes or pipes 201 and 202 provide the entrance and exit for water to cool the cylindrical magnetron during operation.

This magnetron does not require additional trim magnets for shaping the sputtering groove to obtain uniform deposition. Every effort is made to narrow the sputtering racetrack, as much as possible, to obtain an approximation to a "line" source. The width of the racetrack, indicated by 198, should be substantially less than the diameter of substrate 20, as suggested in the illustration. To obtain a uniform coating, the substrate must be moved past the source at constant speed.

Shields 203 are elongated structures bolted to plate 60 that are identical side-to-side and additionally function as the magnetron anode. The opening in 203 is approximately the width of the magnetic structure determined by magnets 170. Shields 204 and 205 are elongated, approximately right angle, structures which attach to the openings in the process chamber apertures similar to the way shields 194 are placed in FIG. 6k. They also have bent tab openings 194a in line with gas passages 79. Shields 204 and 205 are not interchangeable side to side because of the curvatures (concave and convex) required to closely fit the inside and outside diameters of rotor 66. The openings in these shields may be similar to those for 203, but they should be narrower than the width indicated by "W" on rotor shields 142. Sputtering gas is introduced into the cavity around the magnetron and its containing structure 206, for example at point 207 or at any number of locations, such that it can diffuse and flow into the region of the plasma at position 198 through the narrow slits formed by tube 196 and shield 203.

The sequence of coating the substrates in pass-through mode, using the rotary cylindrical magnetron, is illustrated in FIGS. 7b and 7c. The direction of rotation of the rotor is indicated by the arrow labeled "R". Initially the magnetrons are turned off. FIG. 7b shows rotor 66 in a momentarily paused or stationary position. In this position the openings in shields 204 and 205 are blocked by the section of shields 142 indicated by "W". The magnetrons can now be turned on and raised to coating power and allowed to stabilize without coating flux reaching substrate 20 or unprotected areas of rotor 66, i.e. the flux reaches only shields 203, 204, 205, and 142. Rotor 66 is then rotated smoothly and uniformly to the corresponding position on the other side of substrate 20 as shown in FIG. 7c. During the time of rotation of rotor 66, coating flux passing through the openings in shields 204 and 205 provide a uniform coating on each side of substrate 20. Rotation speed and magnetron power are adjusted to achieve the required coating thickness. While the rotor is in the position indicated in FIG. 7c, the magnetrons are turned off. Then rotor 66 is quickly rotated to the next station again pausing in the position shown in FIG. 7b for the magnetrons to be turned on again to repeat the sequence.

It should be noted that substrates other than disks may also be coated by the machine of the present invention. Such substrates may include wafers and flat panel displays. Some substrates may require coating on only one side. In this case only one magnetron, the one facing the substrate, can be used, or two substrates can be mounted back to back and both magnetrons used to increase the throughput.

What is claimed is:

1. A cylindrical carriage sputtering system for depositing one or more layers of material on substrates, comprising:

means forming a cylindrically shaped sealed passageway and including inner and outer concentric hollow cylindrical walls joined together by top and bottom annular sealing flanges, said walls including one or more openings for accommodating one or more processing stations and one or more openings for accommodating one or more pumping stations;

a cylindrical carriage for supporting and moving substrates and formed by a third concentric central hollow cylinder, said cylindrical carriage substantially filling a volume of said cylindrically shaped sealed passageway, and said cylindrical carriage comprising one or more openings provided with substrate holders for supporting one or more substrates;

mechanical and electrical rotation means providing controlled positioning of said cylindrical carriage relative to said inner and outer walls at selected locations around a circumference of said cylindrically shaped sealed passageway;

one or more processing stations disposed at various ones of said wall openings and equipped with devices selected from the group consisting of layer deposition means, substrate heating means, and substrate cooling means;

one or more pumping stations disposed at various other ones of said wall openings and equipped with vacuum pumps for evacuating atmospheric gases and other process gases from said sealed passageway;

vacuum load-lock means and robotic means for loading and unloading said substrates to and from said cylindrical carriage through one or more of said wall openings; and electrical power supply means for operating said rotation means, said processing stations, said pumping stations, said load lock means, and said robotic means.

2. A cylindrical carriage sputtering system as recited in claim 1 wherein said openings in said inner and outer cylindrical walls are equally spaced around the circumference thereof.

3. A cylindrical carriage sputtering system as recited in claim 1 wherein said cylindrical carriage openings are equally spaced around the circumference thereof.

4. A cylindrical carriage sputtering system as recited in claim 1 wherein said substrate holders are adapted to support a multiplicity of said substrates disposed vertically one above the other.

5. A cylindrical carriage sputtering system as recited in claim 4 wherein said substrate holders are adapted to carry four vertically positioned substrates disposed one above the other.

6. A cylindrical sputtering system as recited in claim 4 wherein said substrate holders include a set of four independently adjustable frames, each said frame having a circular opening formed therein and including a slotted support for holding a circular substrate.

7. A cylindrical carriage sputtering system as recited in claim 4 wherein said substrate holders include a frame having at least two separable parts for receipt of said substrates, said substrates being held by at least three notched support fingers.

8. A cylindrical carriage sputtering system as recited in claim 4 wherein said substrate holders include a frame having at least two separable parts for receipt of said substrates, said substrates being held by at least three knife edge fingers adapted to fit into a "V" groove in an outside edge of said substrates.

9. A cylindrical carriage sputtering system as recited in claim 1 wherein said rotation means includes a large circular bearing supporting said cylindrical carriage and a large gear affixed to said carriage and engaged by at least one mating pinion driven by at least one servo motor.

10. A cylindrical carriage sputtering system as recited in claim 1 wherein at least one said processing station includes layer deposition means inoperable in a carriage stationary mode and comprising a circular planar magnetron with magnetic structure defining dual concentric sputtering grooves wherein the inner groove is shallower than the outer groove, whereby a layer of material deposited thereby on a substrate is substantially uniform over a surface of said substrate.

11. A cylindrical carriage sputtering system as recited in claim 1 wherein at least one said processing station includes layer deposition operable means in a carriage passthrough mode and comprising a cylindrical rotary magnetron including a narrow "line source" magnetic structure for coating planar substrates.

12. A cylindrical carriage sputtering system as recited in claim 1 wherein at least one said processing station includes substrate heating means including one or more movable heating devices, said heating devices providing isolated local heating of one or more of said substrates.

13. A cylindrical carriage sputtering system as recited in claim 12 wherein said substrate heating device comprises:

a cylindrically shaped heat-reflecting shield having a cross-sectional shape substantially similar to a substrate to be heated;

a heating source mounted within said heat-reflecting shield;

translation means for moving said heat-reflecting shield and said heating source toward and away from said substrate;

cooling means for cooling said heat-reflecting shield during operation of said heating device; and electrical means to power said heating source.

14. A cylindrical carriage sputtering system as recited in claim 13 wherein said heating source includes at least one quartz lamp.

15. A cylindrical carriage sputtering system as recited in claim 13 wherein said cooling means includes tubing attached to said heat-reflecting shield and chilled fluid circulating through said tubing.

16. A cylindrical carriage sputtering system as recited in claim 13 wherein said heat-reflecting shield is comprised of a first metal having good heat-conducting properties, covered with a thin layer of a second metal having good heat-reflecting properties.

17. A cylindrical carriage sputtering system as recited in claim 16 wherein said heat-reflecting shield is comprised of copper metal plated with a thin layer of gold.

18. A cylindrical carriage sputtering system as recited in claim 1 wherein at least one said processing station includes substrate cooling means having one or more movable cooling devices, said cooling devices providing locally high pressure cooling gas over one or more substrates supported by said holders.

19. A cylindrical carriage sputtering system as recited in claim 18 wherein said cooling device comprises:
    circular cooling platens having substantially the same shape as a substrate to be cooled; and
    including orifices formed inside of said platens facing said substrate;
    means forming passageways for supplying cooling gas to said orifices; and
    translation means for moving said platens toward and away from said substrate.

20. A cylindrical carriage sputtering system as recited in claim 19 wherein said cooling platens include a raised annular ring formed around an edge thereof forming a shallow recessed volume of space between said platen and said substrate.

21. A cylindrical carriage sputtering system as recited in claim 20 wherein said edge of said raised ring on said platen is placed within approximately 0.010 inches from the surface of said substrate, and a helium gas at a pressure of about 20 torr is dispensed into said recessed volume between said platen and said substrate.

22. A cylindrical carriage sputtering system as recited in claim 1 wherein one or more of said processing stations is further equipped with a color difference optical monitoring and controlling device.

23. A cylindrical carriage sputtering system as recited in claim 10 wherein color difference quantities monitored by said monitoring and controlling device, are defined with respect to wavelength-restricting filters, and wherein said filters are blue (B), green (G), and red (R).

24. A cylindrical carriage sputtering system as recited in claim 1 further including means providing a flow of sputtering gas from said processing stations to said pumping stations, wherein said sputtering gas is controlled by variable orifice rotatable valves.

25. A cylindrical carriage sputtering system as recited in claim 1 wherein at least one said vacuum pump includes a turbomolecular pump.

26. A cylindrical carriage sputtering system as recited in claim 1 wherein at least one said vacuum pump includes a cryogenic pump.

27. A cylindrical carriage sputtering system as recited in claim 1 wherein at least one said pumping station includes a mechanical roughing pump, a roots blower pump, and a cryogenic pump attached to said vacuum load-lock means.

28. A coating system for coating one or more substrates, comprising:
    an inner hollow cylinder;
    an outer hollow cylinder disposed concentric with said inner hollow cylinder and cooperating therewith to define a cylindrical chamber; and
    a central hollow cylinder fitted between, and rotatable within said cylindrical chamber relative to said inner and outer hollow cylinders, said central hollow cylinder having receptacle means provided therein for receiving one or more substrates to be coated;
    at least one of said inner and said outer hollow cylinders including
        an input station through which said one or more substrates may be loaded into said coating system;
        an output station through which said substrates may be unloaded out of said coating system; and
    one or more coating stations for coating said substrates.

29. A coating system for coating one or more substrates, comprising:
    an inner hollow cylinder;
    an outer hollow cylinder disposed concentric with said inner hollow cylinder;
    a top annular member connecting upper extremities of said inner and said outer hollow cylinders;
    a bottom annular member connecting lower extremities of said inner and said outer hollow cylinders, said inner hollow cylinder, said outer hollow cylinder, said top annular member, said bottom annular member defining a sealed chamber;
    a central hollow cylinder disposed within said chamber and fitted between, and rotatable relative to, said inner and said outer hollow cylinders, said central hollow cylinder including one or more receptacles for holding said substrates;
    said inner and said outer hollow cylinders including
    an input station through which said one or more substrates may be loaded into said coating system;
    an output station through which said one or more substrates may be unloaded out of said coating system;
    one or more coating stations for coating said substrates; and
    one or more pumping stations for evacuating said chamber.

30. A coating system as recited in claim 29, wherein:
    said top and said bottom annular members are sealing flanges;
    said central cylinder substantially fills said chamber; and
    said inner and said outer hollow cylinders include one or more heating stations for heating substrates carried by said central hollow cylinder and one or more cooling stations for cooling substrates carried by said central hollow cylinder.

31. A coating system as recited in claim 30, wherein;
    said input station includes a vacuum load-lock; and
    said output station includes a vacuum exit-lock.

32. A coating system as recited in claim 31, wherein said one or more coating stations include a planar magnetron and a sputtering target.

33. A coating system as recited in claim 31, and further comprising:
    first robotic means for transferring a plurality of substrates from cassettes carried by a conveyor means to said load-lock and for transferring a plurality of coated substrates from said vacuum exit-lock.

34. A coating station as recited in claim 33, wherein said input station further includes means forming a first transfer chamber having said load-lock disposed on one side thereof and first disk holder means disposed on another side thereof and associated with a first cylinder opening, and second robotic means disposed within said first transfer chamber and operative to transfer substrates from said load-lock to said first disk holder means.

35. A coating station as recited in claim 34, and further comprising:

a first walking mechanism for facilitating the transfer of substrates from said first holder means through said cylinder opening to said receptacles in said central hollow cylinder.

36. A coating system as recited in claim 35 and further comprising:

third robotic means inside said inner hollow cylinder opposite said first disk holder means and operative to cooperate with said first walking mechanism in the transfer of substrates from said first disk holder means to said receptacles.

37. A coating system as recited in claim 36 and further comprising:

fifth robotic means disposed inside said inner hollow cylinder opposite said second disk holder means, and operative to cooperate with said first walking mechanism in the transfer of substrates from said receptacles to said second disk holder means.

38. A coating system as recited in claim 35 wherein said output station further includes, means forming a second transfer chamber having said exit-lock on one side thereof and second disk holder means disposed on another side thereof and associated with a second cylinder opening, and fourth robotic means disposed within said second transfer chamber and operative to transfer substrates from said second disk holder means to said exit-lock, said first robotic means being further operative to transfer substrates from said exit-lock to cassettes carried by the conveyor system.

39. A coating system as recited in claim 38 and further comprising:

a second walking mechanism for facilitating the transfer of substrates from said receptacles in said central cylinder to said second disk holder means.

40. A coating system as recited in claim 39 and further comprising:

fifth robotic means disposed on the inside of said inner hollow cylinder opposite said second disk holder means and operative to cooperate with said second walking mechanism in the transfer of substrates from said receptacles to said second disk holder means.

41. A coating system as recited in claim 33 wherein said conveyor means transports a plurality of substrate carriers in a side-by-side serial sequence and wherein said load-lock includes a plurality of substrate holders disposed in a vertically stacked configuration, and wherein said first robotic means includes an end effector having a plurality of mandrels jointly rotatable between a horizontal relative disposition for simultaneously engaging substrates contained in a plurality of adjacent carriers on said conveyor means, and a vertical relative disposition for inserting the engaged substrates into said vertically stacked load-lock substrate holders.

42. A coating system as recited in claim 41 wherein said end effector includes means for individually rotating each said mandrel about its longitudinal axis as said plurality of mandrels is jointly rotated so that substrates carried by said mandrels maintain a constant attitude as they are transported from carrier to load-lock.

* * * * *